(12) United States Patent
Inoue et al.

(10) Patent No.: US 11,342,466 B2
(45) Date of Patent: May 24, 2022

(54) AMORPHOUS OXIDE SEMICONDUCTOR FILM, OXIDE SINTERED BODY, THIN FILM TRANSISTOR, SPUTTERING TARGET, ELECTRONIC DEVICE, AND AMORPHOUS OXIDE SEMICONDUCTOR FILM PRODUCTION METHOD

(71) Applicant: IDEMITSU KOSAN CO., LTD., Tokyo (JP)

(72) Inventors: Kazuyoshi Inoue, Sodegaura (JP); Masatoshi Shibata, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 134 days.

(21) Appl. No.: 16/482,226

(22) PCT Filed: Jan. 31, 2018

(86) PCT No.: PCT/JP2018/003234
§ 371 (c)(1),
(2) Date: Jul. 30, 2019

(87) PCT Pub. No.: WO2018/143280
PCT Pub. Date: Aug. 9, 2018

(65) Prior Publication Data
US 2020/0052130 A1 Feb. 13, 2020

(30) Foreign Application Priority Data
Feb. 1, 2017 (JP) .............................. JP2017-016783

(51) Int. Cl.
*H01L 29/786* (2006.01)
*C23C 14/08* (2006.01)
(Continued)

(52) U.S. Cl.
CPC ........ *H01L 29/78693* (2013.01); *C04B 35/01* (2013.01); *C23C 14/086* (2013.01);
(Continued)

(58) Field of Classification Search
CPC ................... H01L 29/78693; H01L 29/66439
See application file for complete search history.

(56) References Cited

U.S. PATENT DOCUMENTS

2003/0228457 A1  12/2003  Hasegawa et al.
2011/0168994 A1   7/2011  Kawashima et al.
(Continued)

FOREIGN PATENT DOCUMENTS

CN    104066700 A    9/2014
CN    104291792 A    1/2015
(Continued)

OTHER PUBLICATIONS

Office Action dated Jul. 30, 2021 issued in a corresponding Taiwanese Patent Application No. 107103644, (6 pages).
(Continued)

*Primary Examiner* — Robert G Bachner
(74) *Attorney, Agent, or Firm* — Foley & Lardner LLP

(57) ABSTRACT

A sintered oxide includes an $In_2O_3$ crystal, and a crystal A whose diffraction peak is in an incidence angle (2θ) range defined by (A) to (F) below as measured by X-ray (Cu-K α ray) diffraction measurement: 31.0 to 34.0 degrees . . . (A); 36.0 to 39.0 degrees . . . (B); 50.0 to 54.0 degrees . . . (C); 53.0 to 57.0 degrees . . . (D); 9.0 to 11.0 degrees . . . (E); and 19.0 to 21.0 degrees . . . (F).

8 Claims, 20 Drawing Sheets

(51) Int. Cl.

| | | |
|---|---|---|
| *C23C 14/34* | (2006.01) | |
| *H01L 21/203* | (2006.01) | |
| *H01L 27/12* | (2006.01) | |
| *C04B 35/01* | (2006.01) | |
| *H01L 21/02* | (2006.01) | |
| *H01L 29/66* | (2006.01) | |

(52) U.S. Cl.
CPC .......... *C23C 14/34* (2013.01); *C23C 14/3414* (2013.01); *H01L 21/02565* (2013.01); *H01L 21/02631* (2013.01); *H01L 21/203* (2013.01); *H01L 27/1222* (2013.01); *H01L 27/1225* (2013.01); *H01L 29/66439* (2013.01); *H01L 29/66969* (2013.01); *C04B 2235/761* (2013.01)

(56) References Cited

U.S. PATENT DOCUMENTS

| | | | |
|---|---|---|---|
| 2011/0180763 | A1 | 7/2011 | Utsuno et al. |
| 2012/0292617 | A1 | 11/2012 | Ebata et al. |
| 2013/0285053 | A1 | 10/2013 | Kawashima et al. |
| 2014/0252354 | A1 | 9/2014 | Ebata et al. |
| 2017/0345653 | A1* | 11/2017 | Nishimura ........ H01L 21/02422 |
| 2018/0219098 | A1* | 8/2018 | Inoue .................... C23C 14/086 |

FOREIGN PATENT DOCUMENTS

| | | | | | |
|---|---|---|---|---|---|
| EP | 0266277 | A | | 5/1988 | |
| JP | 2004-008924 | A | | 1/2004 | |
| JP | 2006-100857 | A | | 4/2006 | |
| JP | 2011-146571 | A | | 7/2011 | |
| JP | 2012-211065 | A | | 11/2012 | |
| JP | 2013-067855 | A | | 4/2013 | |
| JP | 2013-100224 | A | | 5/2013 | |
| JP | 2014-098211 | A | | 5/2014 | |
| JP | 2014237808 | A | * | 12/2014 | .......... G02F 1/1339 |
| JP | 2015150701 | A | * | 8/2015 | ......... H01L 29/7869 |
| KR | 10-1996-0001429 | B1 | | 5/1988 | |
| TW | 201439027 | A | | 10/2014 | |
| WO | WO-2010/032422 | A1 | | 3/2010 | |
| WO | WO-2010/032431 | A1 | | 3/2010 | |
| WO | WO-2014/112376 | A1 | | 7/2014 | |
| WO | WO-2016/084636 | A1 | | 6/2016 | |

OTHER PUBLICATIONS

Office Action dated Aug. 17, 2021 issued in a corresponding Japanese Patent Application No. 2018-565610, (13 pages).

International Searching Authority, "International Search Report," issued in connection with International Patent Application No. PCT/JP2018/003234, dated Mar. 6, 2018.

International Searching Authority, "Written Opinion," issued in connection with International Patent Application No. PCT/JP2018/003234, dated Mar. 6, 2018.

Office Action dated May 28, 2021 for a corresponding Chinese patent application No. 201880009057.4 (8 pages).

International Preliminary Report on Patentability dated Aug. 6, 2019 for corresponding Application No. PCT/JP2018/003234 (6 pages).

* cited by examiner

EXAMPLE 1 (1)

EXAMPLE 1 (2)

EXAMPLE 1 (3)

AMORPHOUS OXIDE SEMICONDUCTOR FILM, OXIDE SINTERED BODY, THIN FILM TRANSISTOR, SPUTTERING TARGET, ELECTRONIC DEVICE, AND AMORPHOUS OXIDE SEMICONDUCTOR FILM PRODUCTION METHOD

RELATED APPLICATIONS

The present application claims priority under 37 U.S.C. § 371 to International Patent Application No. PCT/JP2018/003234, filed Jan. 31, 2018, which claims priority to and the benefit of Japanese Patent Application No. 2017-016783, filed on Feb. 1, 2017. The contents of these applications are hereby incorporated by reference in their entireties.

TECHNICAL FIELD

The present invention relates to an amorphous oxide semiconductor film, a sintered oxide, and a thin-film transistor.

BACKGROUND ART

Amorphous oxide semiconductor usable for a thin-film transistor has higher carrier mobility than general-purpose amorphous silicon (a-Si) and a large optical band gap, and can form a film at a low temperature. Accordingly, the use of the amorphous oxide semiconductor is expected in the field of next-generation display devices requiring high-resolution and high-speed large-size image display, and a resin substrate with low heat resistance. The oxide semiconductor (film) is suitably formed through a sputtering process, in which a sputtering target is sputtered. This is because a thin film formed through the sputtering process is more excellent in terms of in-plane uniformity (e.g. composition uniformity in a film plane direction (i.e. within a film plane) and even film thickness) than a thin film formed through ion-plating process, vacuum deposition process or electron beam deposition process, allowing the formation of the thin film with the same composition as that of the sputtering target.

Patent Literature 1 discloses a ceramic component containing $GaAlO_3$ compound. However, Patent Literature 1 does not disclose any oxide semiconductor.

Patent Literature 2 discloses a thin-film transistor including a crystalline oxide semiconductor film containing indium oxide and a trivalent positive metal oxide.

Patent Literature 3 discloses that gallium is solid-dissolved in indium oxide at an atomic ratio Ga/(Ga+In) ranging from 0.001 to 0.12, and one or more oxides selected from yttrium oxide, scandium oxide, aluminum oxide, and boron oxide are added.

Patent Literature 4 discloses a sintered oxide whose atomic ratio Ga/(Ga+In) ranges from 0.10 to 0.15.

Patent Literature 5 discloses a sintered oxide of indium oxide containing gallium oxide and aluminum oxide. The contents of gallium element and aluminum element with respect to all the metal elements range from 0.01 to 0.08, and from 0.0001 to 0.03, respectively.

Patent Literature 6 discloses a sintered oxide containing indium oxide doped with Ga, and tetravalent positive metal at a ratio of more than 100 atom ppm and 700 atom ppm or less to the sum of Ga and indium, where the atomic ratio Ga/(Ga+In) in the indium oxide doped with Ga ranges from 0.001 to 0.15, a crystal structure of the sintered oxide substantially consisting of Bixbyite of indium oxide.

Patent Literature 7 discloses a sintered oxide containing gallium solid-dissolved in indium oxide at an atomic ratio Ga/(Ga+In) ranging from 0.001 to 0.08, the contents of indium and gallium with respect to all of the metal atoms being 80 atom % or more. The sintered oxide has Bixbyite structure of $In_2O_3$ and is added with one or more oxides selected from yttrium oxide, scandium oxide, aluminum oxide, and boron oxide.

Patent Literature 8 discloses a sintered oxide of a sintered oxide consisting of indium oxide, gallium oxide, and aluminum oxide, where: the content of gallium represented by Ga/(In+Ga) (atom number ratio) is in a range from 0.15 to 0.49; the content of aluminum represented by Al/(In+Ga+Al) (atom number ratio) is 0.0001 or more and less than 0.25; and the sintered oxide includes an $In_2O_3$ phase of Bixbyite structure, and generated phase other than the $In_2O_3$ phase including $GaInO_3$ phase of $\beta$-$Ga_2O_3$ structure, or $GaInO_3$ phase of $\beta$-$Ga_2O_3$ structure and $(Ga, In)_2O_3$ phase.

CITATION LIST

Patent Literature(S)

Patent Literature 1 JP 2004-008924 A
Patent Literature 2 WO 2010/032431
Patent Literature 3 WO 2010/032422
Patent Literature 4 JP 2011-146571 A
Patent Literature 5 JP 2012-211065 A
Patent Literature 6 JP 2013-067855 A
Patent Literature 7 JP 2014-098211 A
Patent Literature 8 WO 2016/084636

SUMMARY OF THE INVENTION

Problem(s) to be Solved by the Invention

Meanwhile, there exists strong demand for higher-quality TFT, and for a material exhibiting high carrier mobility and small change in properties during CVD process and the like.

An object of the invention is to provide an amorphous oxide semiconductor film capable of providing a thin-film transistor with high carrier mobility.

Another object of the invention is to provide a sputtering target capable of forming the above amorphous oxide semiconductor film and allowing stable sputtering, and a sintered oxide as a material of the sputtering target.

Means for Solving the Problem(s)

According to an aspect of the invention, a sintered oxide as described below is provided.

[1] A sintered oxide including an $In_2O_3$ crystal, and a crystal A whose diffraction peak is in an incidence angle (2θ) range defined by (A) to (F) below as measured by X-ray (Cu-K α ray) diffraction measurement:

| | |
|---|---|
| 31.0 to 34.0 degrees | (A); |
| 36.0 to 39.0 degrees | (B); |
| 50.0 to 54.0 degrees | (C); |
| 53.0 to 57.0 degrees | (D); |
| 9.0 to 11.0 degrees | (E); and |
| 19.0 to 21.0 degrees | (F). |

[2] The sintered oxide according to [1], where a lattice constant of the $In_2O_3$ crystal is $10.105\times10^{-10}$ m or more and $10.114\times10^{-10}$ m or less.

[3] The sintered oxide according to [1] or [2], where the sintered oxide includes indium element (In), gallium element (Ga), and aluminum element (Al), and the indium element, the gallium element, and the aluminum element are contained at respective atomic ratios as defined in formulae (1) to (3) below, $$0.08 \leq Ga/(In+Ga+Al) \leq 0.30 \quad (1),$$

$$0.05 < Al/(In+Ga+Al) < 0.20 \quad (2), \text{ and}$$

$$0.40 \leq In/(In+Ga+Al) \leq 0.87 \quad (3),$$

where In, Al, and Ga represent the number of atoms of the indium element, the aluminum element, and the gallium element in the sintered oxide, respectively.

[4] The sintered oxide according to [1] or [2], where the sintered oxide includes indium element (In), gallium element (Ga), and aluminum element (Al), and the indium element, the gallium element, and the aluminum element are contained at respective atomic ratios as defined in formulae (4) to (7) below, $$0.08 \leq Ga/(In+Ga+Al) \leq 0.30 \quad (4),$$

$$0.05 \leq Al/(In+Ga+Al) \leq 0.30 \quad (5),$$

$$0.40 \leq In/(In+Ga+Al) \leq 0.87 \quad (6), \text{ and}$$

$$Ga/(In+Ga) < 0.15 \quad (7),$$

where In, Al, and Ga represent the number of atoms of the indium element, the aluminum element, and the gallium element in the sintered oxide, respectively.

[5] The sintered oxide according to [1] or [2], where the sintered oxide includes indium element (In), gallium element (Ga), and aluminum element (Al), and atomic ratios of the indium element, the gallium element, and the aluminum element in an In—Ga—Al ternary composition diagram are in a range defined by (R1) to (R5) below, $$In:Ga:Al=0.51:0.30:0.19 \quad (R1),$$

$$In:Ga:Al=0.73:0.08:0.19 \quad (R2),$$

$$In:Ga:Al=0.87:0.08:0.05 \quad (R3),$$

$$In:Ga:Al=0.88:0.10:0.02 \quad (R4), \text{ and}$$

$$In:Ga:Al=0.78:0.20:0.02 \quad (R5).$$

[6] The sintered oxide according to any one of [1] to [5], where a relative density of the sintered oxide is 95% or more and a bulk resistivity of the sintered oxide is 10 mΩcm or less.

According to another aspect of the invention, a sputtering target as described below is provided.

[7] A sputtering target including: a backing plate; and the sintered oxide according to any one of [1] to [6], the sintered oxide being bonded to the backing plate.

According to still another aspect of the invention, a production method of a semiconductor film as described below is provided.

[8] A production method of an amorphous oxide semiconductor film, the method including:

forming a thin film using the sputtering target according to [7];

forming a protection film on the thin film; and applying a heat treatment after forming the protection film.

[9] The production method of an amorphous oxide semiconductor film according to [8], where the heat treatment is applied under atmospheric air at a temperature ranging from 250 degrees C. to 400 degrees C.

[10] An amorphous oxide semiconductor film including indium oxide, gallium oxide and aluminum oxide as main components, the amorphous oxide semiconductor film satisfying atomic ratios as defined in formulae (8) to (10) below, $$0.08 \leq Ga/(In+Ga+Al) \leq 0.30 \quad (8),$$

$$0.05 < Al/(In+Ga+Al) < 0.20 \quad (9), \text{ and}$$

$$0.40 \leq In/(In+Ga+Al) \leq 0.87 \quad (10),$$

where In, Al, and Ga represent the number of atoms of the indium element, the aluminum element, and the gallium element in the sintered oxide, respectively.

[11] An amorphous oxide semiconductor film including indium oxide, gallium oxide and aluminum oxide as main components, where atomic ratios of indium element (In), gallium element (Ga), and aluminum element (Al) in an In—Ga—Al ternary composition diagram are in a range defined by (R1) to (R5) below, $$In:Ga:Al=0.51:0.30:0.19 \quad (R1),$$

$$In:Ga:Al=0.73:0.08:0.19 \quad (R2),$$

$$In:Ga:Al=0.87:0.08:0.05 \quad (R3),$$

$$In:Ga:Al=0.88:0.10:0.02 \quad (R4), \text{ and}$$

$$In:Ga:Al=0.78:0.20:0.02 \quad (R5).$$

According to further aspect of the invention, a thin-film transistor as described below is provided.

[12] A thin-film transistor including the amorphous oxide semiconductor film according to [10] or [11].

[13] The thin-film transistor according to [12], where a saturation mobility of the thin-film transistor is 5 cm²/V·s or more.

[14] The thin-film transistor according to [12] or [13], where an On/Off ratio of the thin-film transistor is $1\times10^6$ or more.

[15] The thin-film transistor according to any one of [12] to [14], where an off current of the thin-film transistor is $1\times10^{-11}$ A or less.

According to a further aspect of the invention, an electronic device as described below is provided.

[16] An electronic device including the thin-film transistor according to any one of [12] to [15].

According to the aspects of the invention, a target capable of stable sputtering is provided, a thin film produced from the target being capable of providing an excellent amorphous oxide semiconductor film with high carrier mobility in TFT.

BRIEF DESCRIPTION OF DRAWING(S)

DESCRIPTION OF EMBODIMENT(S)

Sintered Oxide

Figure 1:
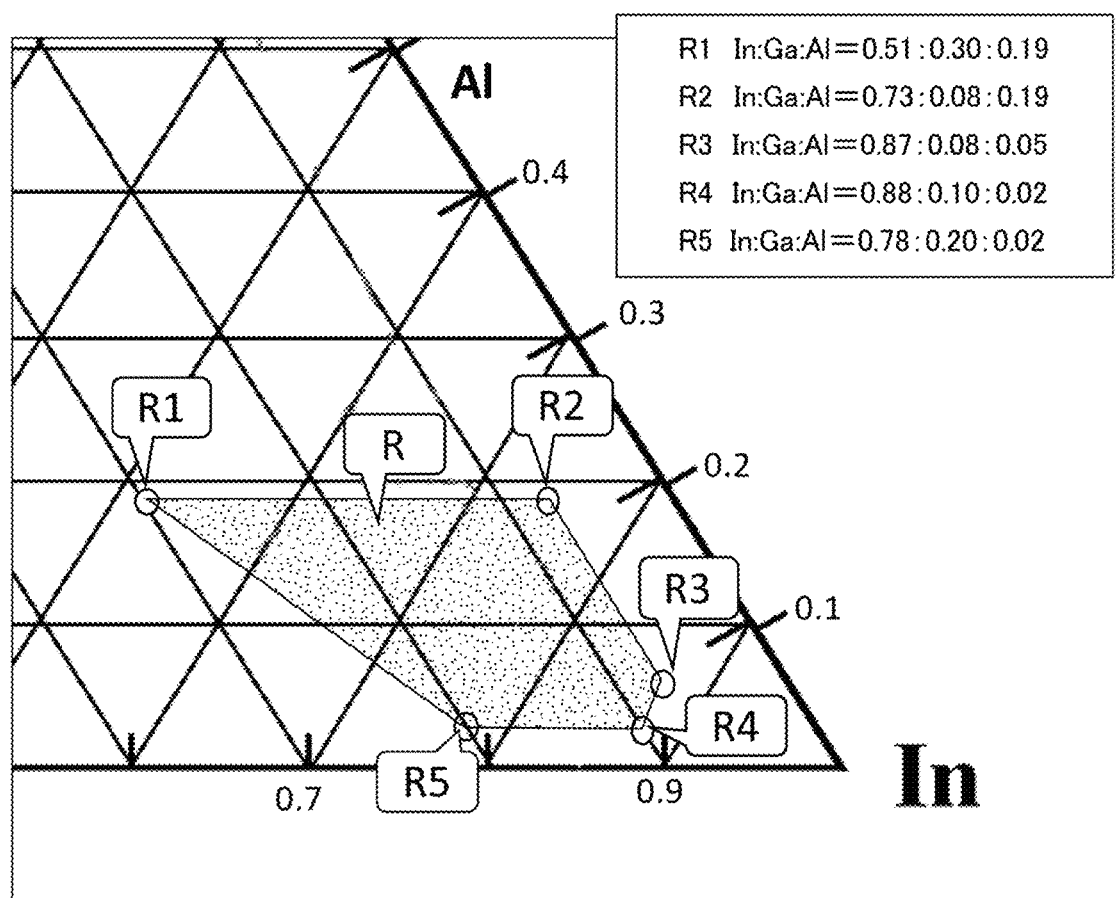
FIG. 1 is an In—Ga—Al ternary composition diagram showing a preferable example of composition range of a sintered oxide according to an exemplary embodiment of the invention.

A sintered oxide according to an exemplary embodiment of the invention includes $In_2O_3$ crystal and crystal A having diffraction peaks at incidence angle (2θ) as defined in (A) to (F) below, which are measured by X-ray (Cu-K α ray) diffraction measurement.

| | |
|---|---|
| 31.0 degrees to 34.0 degrees | (A) |
| 36.0 degrees to 39.0 degrees | (B) |
| 50.0 degrees to 54.0 degrees | (C) |
| 53.0 degrees to 57.0 degrees | (D) |
| 9.0 degrees to 11.0 degrees | (E) |
| 19.0 degrees to 21.0 degrees | (F) |

The sintered oxide according to the exemplary embodiment of the invention, which contains $In_2O_3$ crystal, is excellent in electrical conductivity and mechanical strength, and thus can provide a sputtering target free from cracks and abnormal electrical discharge even at film-formation with large power.

The presence of the $In_2O_3$ crystal and the crystal with diffraction peaks at angle 2θ ranges of 31 to 34 degrees, 36 to 39 degrees, 50 to 54 degrees, 53 to 57 degrees, 9.0 to 11.0 degrees and 19.0 to 21.0 degrees in an XRD chart in the sintered oxide can be determined through XRD (X-Ray Diffraction) measurement.

It is found through JADE6 analysis that the crystal with diffraction peaks at angle 2θ ranges of 31 to 34 degrees, 36 to 39 degrees, 50 to 54 degrees, 53 to 57 degrees, 9 to 11 degrees and 19 to 21 degrees in an XRD chart does not match known compounds but has unknown crystal phase. The sintered oxide contains the unknown compound.

A lattice constant of the $In_2O_3$ crystal contained in the sintered oxide is preferably $10.105 \times 10^{-10}$ m or more and $10.114 \times 10^{-10}$ m or less.

With the lattice constant of the $In_2O_3$ crystal being $10.105 \times 10^{-10}$ m or more, distortion inside the indium oxide crystal becomes small, thereby preventing occurrence of cracks during sintering, cracks during shaping the sintered oxide by grinding and polishing into a shape of a target, and cracks due to thermal distortion when the sintered oxide is bonded to a backing plate. Meanwhile, with the lattice constant of the $In_2O_3$ crystal being $10.114 \times 10^{-10}$ m or less, occurrence of cracks when the distortion inside the indium oxide crystal becomes large and decrease in carrier mobility in a thin-film transistor can be prevented.

The lattice constant of $In_2O_3$ crystal is more preferably in a range from $10.108 \times 10^{-10}$ m to $10.114 \times 10^{-10}$ m, further preferably $10.110 \times 10^{-10}$ m to $10.114 \times 10^{-10}$ m.

The lattice constant of $In_2O_3$ crystal itself is $10.114 \times 10^{-10}$ m. $GaAlO_3$ crystal contained in the sintered oxide can reduce the lattice constant of $In_2O_3$ crystal contained in the sintered oxide as compared with the lattice constant of the $In_2O_3$ crystal itself. The smaller lattice constant of the $In_2O_3$ crystal contained in the sintered oxide than the lattice constant of the $In_2O_3$ crystal itself reduces interatomic distance between indium ions and increases S orbital overlap, so that carrier mobility in a thin-film transistor including a semiconductor film made with the use of the sintered oxide can be increased.

Further, the crystal A deposited in the sintered oxide prevents the lattice constant of the $In_2O_3$ crystal from falling below $10.105 \times 10^{-10}$ m. When the added gallium oxide and aluminum oxide are solid-dissolved in the indium oxide and the crystal A is not deposited, the lattice constant of the $In_2O_3$ crystal falls below $10.105 \times 10^{-10}$ m, sometimes causing cracks on the target.

The lattice constant of $In_2O_3$ crystal contained in the sintered oxide can be calculated by WPF (Whole Pattern Fitting) using a crystal-structure analysis software based on an XRD pattern obtained through XRD (X-Ray Diffraction) measurement.

The sintered oxide according to the exemplary embodiment of the invention preferably contains an oxide containing indium element (In), gallium element (Ga) and aluminum element (Al) at atomic ratios as defined by formulae (1) to (3) below.

$$0.08 \leq Ga/(In+Ga+Al) \leq 0.30 \quad (1)$$

$$0.05 < Al/(In+Ga+Al) < 0.20 \quad (2)$$

$$0.40 \leq In/(In+Ga+Al) \leq 0.87 \quad (3)$$

In the above formulae, In, Al, and Ga represent number of indium atoms, aluminum atoms, and gallium atoms in the sintered oxide, respectively.

The Ga content satisfying the lower limit defined in the formula (1) prevents excessive crystallization of the indium oxide in the oxide film formed with the use of the sintered oxide, excessive decrease in the carriers, which results in the oxide film in a form of an insulator (i.e. not a semiconductor) and failure in serving as TFT, decrease in the carrier mobility, and failure to exhibit an improvement in light transmission properties as desired. The Ga content satisfying the upper limit in the formula (1) keeps the oxide film from being an insulator.

The Al content satisfying the lower limit in the formula (2) improves the light transmissivity of the oxide film formed with the use of the sintered oxide, and ensures the stability of the TFT (especially, prevents the oxide film from being electrically conductive when a thin film made of $SiO_2$, SiNx or the like such as interlayer insulating film is formed through CVD (Chemical Vapor Deposition)). The Al content satisfying the upper limit in the formula (2) keeps the oxide film from being an insulator.

The In content satisfying the upper lower in the formula (3) keeps the sintered oxide from being an insulator. If the lower limit of the formula (3) is not satisfied, the carrier in the resultant oxide film is sometimes excessively reduced to turn the oxide film into an insulator (i.e. not a semiconductor), the oxide film sometimes does not serve as a TFT and, even if the oxide film serves as a semiconductor, the carrier mobility becomes too small to be practical for use. The In content satisfying the upper limit in the formula (3) prevents increase in the carrier in the oxide film and keeps the oxide film from being a conductive film.

The above atomic ratios can be measured through ICP-AES (Inductively Coupled Plasma-Atomic Emission Spectrometry).

The sintered oxide according to an exemplary embodiment of the invention preferably satisfies an atomic ratio as defined in the formula (1X) below.

$$0.08 \leq Ga/(In+Ga) < 0.15 \quad (1X)$$

The sintered oxide according to an exemplary embodiment of the invention more preferably satisfies atomic ratios as defined in the formulae (1A) to (3A) below.

$$0.10 \leq Ga/(In+Ga+Al) \leq 0.15 \quad (1A)$$

$$0.05 < Al/(In+Ga+Al) < 0.20 \quad (2A)$$

$$0.60 \leq In/(In+Ga+Al) \leq 0.85 \quad (3A)$$

Further preferably, the sintered oxide satisfies the following atomic ratios.

$$0.10 \leq Ga/(In+Ga+Al) \leq 0.15 \quad (1B)$$

$$0.07 \leq Al/(In+Ga+Al) < 0.20 \quad (2B)$$

$$0.60 \leq In/(In+Ga+Al) \leq 0.83 \quad (3B)$$

In the above formulae, In, Al, and Ga represent number of indium atoms, aluminum atoms, and gallium atoms in the sintered oxide, respectively.

The sintered oxide according to an exemplary embodiment of the invention preferably contains indium element (In), gallium element (Ga), and aluminum element (Al), the indium element, gallium element, and aluminum element preferably satisfying the atomic ratios as defined by the formulae (4) to (7) below.

$$0.08 \leq Ga/(In+Ga+Al) \leq 0.30 \quad (4)$$

$$0.05 \leq Al/(In+Ga+Al) \leq 0.30 \quad (5)$$

$$0.40 \leq In/(In+Ga+Al) \leq 0.87 \quad (6)$$

In the above formulae, In, Al, and Ga represent number of indium atoms, aluminum atoms, and gallium atoms in the sintered oxide, respectively.

$$Ga/(In+Ga) < 0.15 \quad (7)$$

When the atomic ratios as defined in the formulae (4) to (7) are satisfied, the sintered oxide more preferably satisfies atomic ratios as defined in formulae (4A) to (6A) below.

$$0.08 \leq Ga/(In+Ga+Al) \leq 0.30 \quad (4A)$$

$$0.05 \leq Al/(In+Ga+Al) \leq 0.25 \quad (5A)$$

$$0.45 \leq In/(In+Ga+Al) \leq 0.80 \quad (6A)$$

Further preferably, the sintered oxide satisfies the following atomic ratios.

$$0.10 \leq Ga/(In+Ga+Al) \leq 0.25 \quad (4B)$$

$$0.07 \leq Al/(In+Ga+Al) \leq 0.25 \quad (5B)$$

$$0.50 \leq In/(In+Ga+Al) \leq 0.78 \quad (6B)$$

In the above formulae, In, Al, and Ga represent number of indium atoms, aluminum atoms, and gallium atoms in the sintered oxide, respectively.

The sintered oxide according to an exemplary embodiment of the invention preferably contains indium element (In), gallium element (Ga) and aluminum element (Al) at an atomic ratio being in a range R in an In—Ga—Al ternary composition diagram as defined by (R1) to (R5) below.

$$In:Ga:Al=0.51:0.30:0.19 \quad (R1)$$

$$In:Ga:Al=0.73:0.08:0.19 \quad (R2)$$

$$In:Ga:Al=0.87:0.08:0.05 \quad (R3)$$

$$In:Ga:Al=0.88:0.10:0.02 \quad (R4)$$

$$In:Ga:Al=0.78:0.20:0.02 \quad (R5)$$

The range R herein refers to a range (polygon) defined by connecting the points (apexes) represented by the composition ratios R1, R2, R3, R4, R5 in FIG. 1 with straight lines.

The sintered oxide according to an exemplary embodiment of the invention may contain inevitable impurities. The inevitable impurities herein mean an element(s) that is not intentionally added but are mixed in a material or during a production process. The same applies to the description below. Examples of the inevitable impurities include alkali metal and alkaline earth metal (Li, Na, K, Rb, Mg, Ca, Sr, Ba and the like). The content of the inevitable impurities is 10 ppm or less, preferably 1 ppm or less, further preferably 100 ppb or less. The concentration of impurities can be measured using ICP or SIMS. Hydrogen, nitrogen and/or halogen atom may be contained in addition to the alkali metal and alkaline earth metal. In this case, the concentration by SIMS measurement is 5 ppm or less, preferably 1 ppm or less, more preferably 100 ppb or less.

A relative density of the sintered oxide according to an exemplary embodiment of the invention is preferably 95% or more, more preferably 96% or more, further preferably 97% or more, and especially preferably 98% or more.

With the relative density of the sintered oxide being 95% or more, the strength of the resultant target is enhanced, thereby preventing cracks on the target and abnormal electrical discharge when a film is formed with large power. Further, failure in improvement in a film density of the resultant oxide film and consequent deterioration and/or instability in TFT properties can be prevented.

The relative density is measurable according to the method described in Examples.

Bulk resistivity of the sintered oxide according to an exemplary embodiment of the invention is preferably 10 mΩcm or less.

At the bulk resistivity of the sintered oxide of 10 mΩcm or less, the resistance of the resultant target is lowered, thereby generating stable plasma. Further, arc discharge (also called as fireball discharge) becomes unlikely to occur, thereby keeping the target surface from being melted or cracked.

The bulk resistivity is measurable according to the method described in Examples.

The contents of the metal elements contained in the sintered oxide according to an exemplary embodiment of the invention may be the same as the contents of the metal elements in the amorphous oxide semiconductor film according to an exemplary embodiment of the invention, which is obtained from the sintered oxide.

Production Method of Sintered Oxide

The sintered oxide according to an exemplary embodiment of the invention can be produced by mixing material powders, molding the material, and sintering the material.

Examples of the material include indium compounds, gallium compounds, and aluminum compounds, which are preferably oxides. Specifically, indium oxide ($In_2O_3$), gallium oxide ($Ga_2O_3$), and aluminum oxide ($Al_2O_3$) are suitably usable.

Though any commercially available indium oxide powder is usable, high-purity (e.g. 4N (0.9999) or more) indium oxide powder is preferable. In place of or in addition to indium oxide, other indium salt such as indium chloride, indium nitrate, and indium acetate is usable.

Though any commercially available gallium oxide powder is usable, high-purity (e.g. 4N (0.9999) or more) gallium oxide powder is preferable. In place of or in addition to gallium oxide, other gallium salt such as gallium chloride, gallium nitrate, and gallium acetate is usable.

Though any commercially available aluminum oxide powder is usable, high-purity (e.g. 4N (0.9999) or more) aluminum oxide powder is preferable. In place of or in addition to oxide, other aluminum salt such as aluminum chloride, aluminum nitrate, and aluminum acetate is usable.

The material powders are preferably mixed at the atomic ratios according to the formulae (1) to (3).

$$0.08 \leq Ga/(In+Ga+Al) \leq 0.30 \quad (1)$$

$$0.05 < Al/(In+Ga+Al) < 0.20 \quad (2)$$

$$0.40 \leq In/(In+Ga+Al) \leq 0.87 \quad (3)$$

In the above formulae, In, Al, and Ga represent number of indium atoms, aluminum atoms, and gallium atoms in the used material powders, respectively.

The material powders are more preferably mixed at the atomic ratios according to the formulae (4) to (7).

$$0.15 \leq Ga/(In+Ga+Al) \leq 0.30 \quad (4)$$

$$0.05 \leq Al/(In+Ga+Al) \leq 0.30 \quad (5)$$

$$0.40 \leq In/(In+Ga+Al) \leq 0.87 \quad (6)$$

$$Ga/(In+Ga) < 0.15 \quad (7)$$

In the above formulae, In, Al, and Ga represent number of indium atoms, aluminum atoms, and gallium atoms in the used material powders, respectively.

Alternatively, the atomic ratios of indium element, aluminum element, and gallium element in the used material powders is preferably within a range R defined by (R1) to (R5) below in the In—Ga—Al ternary composition diagram shown in FIG. 1.

$$In:Ga:Al=0.51:0.30:0.19 \quad (R1)$$

$$In:Ga:Al=0.73:0.08:0.19 \quad (R2)$$

$$In:Ga:Al=0.87:0.08:0.05 \quad (R3)$$

$$In:Ga:Al=0.88:0.10:0.02 \quad (R4)$$

$$In:Ga:Al=0.78:0.20:0.02 \quad (R5)$$

In the mixing step, which is not particularly limited, the material powders are mixed and pulverized at one time or separately in two or more times. Examples of the mixer/pulverizer include known apparatuses such as a ball mill, bead mill, jet mill, and ultrasonic devices.

The material prepared in the mixing step is molded and sintered according to known processes to provide the sintered oxide.

In the molding step, the mixed powder obtained in the mixing step is subjected to, for instance, pressure-forming to form a molding body. Through the above step, the material powder is molded into a shape of a product (e.g. a shape suitable for a sputtering target).

Examples of the molding process include metallic molding, die-casting, and injection molding. However, the material powder is preferably molded through CIP (Cold Isostatic Press) or the like in order to obtain a sintered oxide with a high sintering density.

In the molding process, a molding aid such as polyvinyl alcohol, methyl cellulose, polywax, and oleic acid may be used.

In the sintering step, the molding body obtained in the molding step is sintered.

The sintering step is performed in an atmospheric pressure, in an oxygen atmosphere or in pressurized oxygen atmosphere, usually in a temperature range from 1200 to 1550 degrees C., for 30 minutes to 360 hours, preferably 8 to 180 hours, more preferably for 12 to 96 hours. When the sintering temperature is less than 1200 degrees C., the density of the target may be not easily increased or too much time may be required in order to sinter the molding body. Meanwhile, when the sintering temperature exceeds 1550 degrees C., the material may be partly gasified, so that the composition of the material falls outside the desired range or the furnace may be damaged.

When the sintering time is less than 30 minutes, the density of the target is not easily increased. Meanwhile, the sintering time of more than 360 is not practically available in view of excessive production time and cost. The sintering time within the above range can increase the relative density and lower the bulk resistivity.

Sputtering Target

The sputtering target can be produced using the sintered oxide according to an exemplary embodiment of the invention. Specifically, the sintered oxide is ground and polished, and is bonded to a backing plate to provide the sputtering target.

A bonding rate to the backing plate is preferably 95% or more. The bonding rate can be measured in an X-ray CT.

The sputtering target according to an exemplary embodiment of the invention (referred to as the present target hereinafter) includes the above sintered oxide (referred to as the present sintered oxide hereinafter), and the backing plate. The sputtering target according to the exemplary embodiment of the invention preferably includes the present sintered oxide and, as necessary, a cooler/holder (e.g. the backing plate) provided on the sintered oxide.

The sintered oxide (target material) of the present target is provided by grinding a surface of the above-described present sintered oxide. Accordingly, the substance of the target material is the same as the present sintered oxide. The explanation on the present sintered oxide thus directly applies to the target material.

Figure 2A:
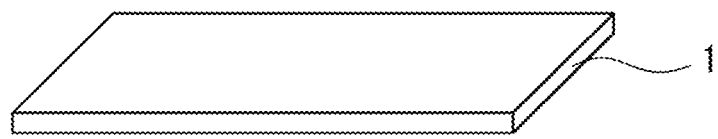
FIG. 2A is a perspective view showing a shape of a target according to an exemplary embodiment of the invention.
Figure 2B:
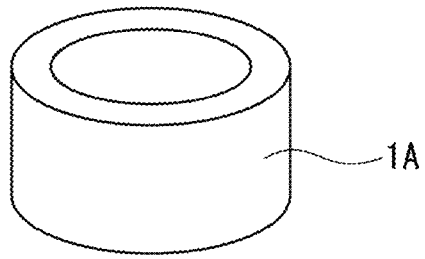
FIG. 2B is a perspective view showing a shape of a target according to another exemplary embodiment of the invention.
Figure 2C:
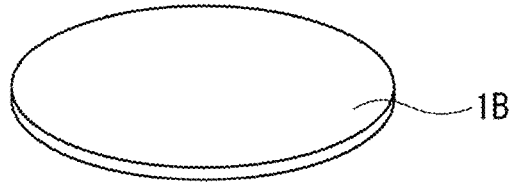
FIG. 2C is a perspective view showing a shape of a target according to still another exemplary embodiment of the invention.
Figure 2D:
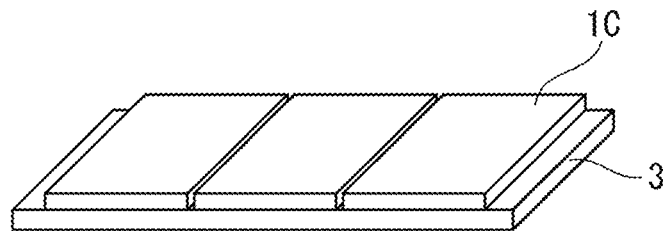
FIG. 2D is a perspective view showing a shape of a target according to a further exemplary embodiment of the invention.

The shape of the sintered oxide is not particularly limited. For instance, the sintered oxide may be in a plate as shown in FIG. 2A (item 1) or a hollow cylinder as shown in FIG. 2B (item 1A). When the sintered oxide is plate-shaped, the sintered oxide may be rectangular in a plan view as shown in FIG. 2A (item 1) or circular in a plan view as shown in FIG. 2C (item 1B). The sintered oxide may be a single-piece molding body or may be a multiple-division component including a plurality of divided sintered oxides (item 1C) fixed on a backing plate 3 as shown in FIG. 2D.

The backing plate 3 is a holder/cooler for the sintered oxide. The backing plate 3 is preferably made of a material with excellent thermal conductivity (e.g. copper).

The sputtering target is produced through, for instance, the following steps.

A step for grinding a surface of the sintered oxide (grinding step).

A step for bonding the sintered oxide on the backing plate (bonding step).

The above steps will be specifically described below.

Grinding Step

In the grinding step, the sintered oxide is ground into a shape adapted to be attached to a sputtering apparatus.

The surface of the sintered oxide is often partially highly oxidized or roughened. Further, the sintered oxide has to be cut into piece(s) of a predetermined size.

The surface of the sintered oxide is preferably ground for 0.3 mm or more. The grinding depth is more preferably 0.5 mm or more, especially preferably 2 mm or more. A part of the sintered oxide at or near the surface thereof, at which crystal structure is modified, can be removed by grinding 0.3 mm or more.

It is preferable to grind the sintered oxide using, for instance, a surface grinder to form a material whose average surface roughness Ra is 5 μm or less. A sputtering surface of the sputtering target may further be mirror-finished so that the average surface roughness Ra is $1000 \times 10^{-10}$ m or less. The mirror-finishing (polishing) may be performed using any known polishing technique including mechanical polishing, chemical polishing, and mechanochemical polishing (combination of the mechanical polishing and chemical polishing). For instance, the surface may be polished using a fixed-abrasive-grain polisher (polishing liquid: water) to #2000 or finer grain size, or may be lapped using diamond-paste polishing material after lapping using a loose-abrasive-grain lapping material (polishing material: SiC paste etc.). The polishing method is not limited to the above. Examples of the polishing material include a polishing material with #200 grit size, #400 grit size, and #800 grit size.

The sintered oxide after the polishing step is preferably cleaned with an air blower or washed with running water and the like. When a foreign substance is to be removed using an air blower, air is preferably sucked with a dust catcher provided at a side opposite a nozzle for effective removal. It should be noted that ultrasonic cleaning may further be performed in view of the limited cleaning power of the air blower and running water. The ultrasonic cleaning is effectively performed with multiple frequencies ranging from 25 kHz to 300 kHz. For instance, twelve waves of different frequencies ranging from 25 kHz to 300 kHz in 25 kHz increments are preferably applied for the ultrasonic cleaning.

Bonding Step

In the bonding step, the sintered oxide after being ground is bonded to the backing plate using a low-melting-point metal such as indium.

The sputtering target has been described as the above.

Amorphous Oxide Semiconductor Film

The amorphous oxide semiconductor film according to an exemplary embodiment of the invention preferably contains indium oxide, gallium oxide, and aluminum oxide as main components.

The amorphous oxide semiconductor film, which is amorphous, usually entails a large number of energy levels in a band gap. Accordingly, absorbance at ends of the band occurs, where carriers or vacancies are created by absorption of, especially, the short-wavelength light, so that threshold voltage (Vth) of the thin-film transistor (TFT) using an amorphous oxide semiconductor film may be changed to significantly deteriorate the TFT properties or the thin-film transistor may not serve as a transistor.

The amorphous oxide semiconductor film according to the exemplary embodiment of the invention simultaneously contains the indium oxide, gallium oxide, and aluminum oxide, so that the absorption end shifts toward the short-wavelength side, and the amorphous oxide semiconductor film does not absorb the light in a visible light region, thereby improving photostability. The presence of gallium ions and aluminum ions, whose ion diameters are smaller than the ion diameter of indium, reduces the distance between positive ions, thereby improving the carrier mobility in TFT. Further, since the indium oxide, gallium oxide, and aluminum oxide are simultaneously contained, an amorphous oxide semiconductor film with excellent carrier mobility, transparency and photostability can be provided.

The "indium oxide, gallium oxide, and aluminum oxide as main components" in the invention means that indium oxide, gallium oxide, and aluminum oxide accounts for 50 mass % or more, preferably 70 mass % or more, more preferably 80 mass % or more, further preferably 90 mass % or more of the oxides in the oxide film.

When the contents of the indium oxide, gallium oxide, and aluminum oxide are less than 50 mass % of the oxides, saturation mobility in the thin-film transistor may be deteriorated.

Whether the oxide film is "amorphous" in the invention can be determined based on an absence of clear peak(s) in an X-ray diffraction measurement of the oxide film (i.e. showing a broad pattern).

The amorphous oxide film can provide excellent uniformity of the film surface and reduce in-plane unevenness of the TFT properties.

The amorphous oxide semiconductor film according to an exemplary embodiment of the invention satisfies the atomic ratios below.

$$0.08 \leq Ga/(In+Ga+Al) \leq 0.30 \tag{8}$$

$$0.05 < Al/(In+Ga+Al) < 0.20 \tag{9}$$

$$0.40 \leq In/(In+Ga+Al) \leq 0.87 \tag{10}$$

In the above formulae, In, Al, and Ga represent number of indium atoms, aluminum atoms, and gallium atoms in the amorphous oxide semiconductor film, respectively.

The content of gallium element in the amorphous oxide semiconductor film is $0.08 \leq Ga/(In+Ga+Al) \leq 0.30$. When Ga/(In+Ga+Al) is less than 0.08, the indium oxide in the oxide film is sometimes crystallized to reduce too much carriers to serve as a semiconductor (i.e. resulting in an insulator), thereby possibly failing to serve as a TFT, reducing carrier mobility, and failing to exhibit desired improvement in light transmission properties. Meanwhile, when Ga/(In+Ga+Al) is more than 0.30, the oxide film may become an insulator instead of a semiconductor, failing to serve as a TFT.

The content of gallium element preferably satisfies the following atomic ratio.

$$0.08 \leq Ga/(In+Ga+Al) \leq 0.25 \tag{8X}$$

Further preferably, the content of gallium element satisfies the following atomic ratio.

$$0.10 \leq Ga/(In+Ga+Al) \leq 0.25 \tag{8Y}$$

The content of aluminum element in the amorphous oxide semiconductor film is $0.05<Al/(In+Ga+Al)<0.20$. At Al/(In+Ga+Al) of 0.05 or less, the light transmissivity of the semiconductor film is not expectable, and the oxide film may be reduced to be electrically conductive to impair the stability of the TFT (especially, when a thin film made of $SiO_2$, SiNx or the like such as interlayer insulating film is formed through CVD (Chemical Vapor Deposition)). Meanwhile, when Al/(In+Ga+Al) is 0.20 or more, the oxide film may become an insulator instead of a semiconductor, failing to serve as a TFT.

The content of aluminum element preferably satisfies the following atomic ratio.

$$0.06 \leq Al/(In+Ga+Al) < 0.20 \tag{9X}$$

The amorphous oxide semiconductor film according to an exemplary embodiment of the invention preferably satisfies an atomic ratio as defined in the formula (7X) below.

$$0.08 \leq Ga/(In+Ga) < 0.15 \tag{7X}$$

The amorphous oxide semiconductor film according to an exemplary embodiment of the invention preferably satisfies atomic ratios as defined in the formulae (8A) to (10A) below.

$$0.08 \leq Ga/(In+Ga+Al) \leq 0.15 \tag{8A}$$

$$0.05 < Al/(In+Ga+Al) < 0.20 \tag{9A}$$

$$0.60 \leq In/(In+Ga+Al) \leq 0.85 \tag{10A}$$

The amorphous oxide semiconductor film according to an exemplary embodiment of the invention further preferably satisfies the atomic ratios below.

$$0.08 \leq Ga/(In+Ga+Al) \leq 0.15 \tag{8B}$$

$$0.06 \leq Al/(In+Ga+Al) \leq 0.19 \tag{9B}$$

$$0.60 \leq In/(In+Ga+Al) \leq 0.83 \tag{10B}$$

In the above formulae, In, Al, and Ga represent number of indium atoms, aluminum atoms, and gallium atoms in the sintered oxide, respectively.

An amorphous oxide semiconductor film according to another exemplary embodiment of the invention contains indium oxide, gallium oxide and aluminum oxide as main components, where the atomic ratios of indium element (In), gallium element (Ga), and aluminum element (Al) are in a range R defined by (R1) to (R5) below in an In—Ga—Al ternary composition diagram as shown in FIG. 1.

$$In:Ga:Al=0.51:0.30:0.19 \tag{R1}$$

$$In:Ga:Al=0.73:0.08:0.19 \tag{R2}$$

$$In:Ga:Al=0.87:0.08:0.05 \tag{R3}$$

$$In:Ga:Al=0.88:0.10:0.02 \tag{R4}$$

$$In:Ga:Al=0.78:0.20:0.02 \tag{R5}$$

The range R herein refers to a range (polygon) defined by connecting the points (apexes) represented by the composition ratios R1, R2, R3, R4, R5 in FIG. 1 with straight lines.

The above atomic ratios can be determined by measuring the amount of the elements through ICP-AES (Inductively Coupled Plasma-Atomic Emission Spectrometry) or XRF (X-Ray Fluorescence) measurement. An inductively coupled plasma emission spectrometer can be used for the ICP measurement. A thin-film X-ray fluorescence spectrometer (AZX400, manufactured by Rigaku Corporation) can be used for the XRF measurement.

A sector-dynamic SIMS (Secondary Ion Mass Spectrometer) analysis may alternatively be used for analysis of the contents (atomic ratio) of the metal elements in the oxide semiconductor thin-film at the same accuracy as the inductively coupled plasma emission spectrometry. A reference material is prepared by forming source/drain electrodes (made of the same material as in TFT device) of a channel length on an upper surface of a reference oxide thin-film whose atomic ratio of the metal elements are known by measurement using the inductively coupled plasma emission spectrometer or the thin-film X-ray fluorescence spectrometer. Then, the oxide semiconductor layer is analyzed using a sector-dynamic SIMS (Secondary Ion Mass Spectrometer) (IMS 7f-Auto, manufactured by AMETEK, Inc.) to measure a mass spectrum intensity of each of the elements, and plot analytical curves for concentrations of the known elements and the mass spectrum intensity. Next, the atomic ratio in the oxide semiconductor film of an actual TFT device is calculated with reference to the above-described analytical curve based on the spectrum intensity obtained by the sector-dynamic SIMS (Secondary Ion Mass Spectrometry) analysis. As a result of the calculation, it is found that the calculated atomic ratio is within 2 at. % of the atomic ratio of the oxide semiconductor film separately measured by the thin-film X-ray fluorescent spectrometer or the inductively coupled plasma emission spectrometer.

The metal elements contained in the amorphous oxide semiconductor film according to an exemplary embodiment of the invention include indium, gallium, and aluminum, or may consist essentially of indium, gallium, and aluminum. In this case, inevitable impurities may be contained in the amorphous oxide semiconductor film. 80 atom % or more, 90 atom % or more, 95 atom % or more, 96 atom % or more, 97 atom % or more, 98 atom % or more, or 99 atom % or more of the metal elements contained in the amorphous oxide semiconductor film according to an exemplary embodiment of the invention may consist of indium, gallium and aluminum. The metal elements contained in the amorphous oxide semiconductor film according to an exemplary embodiment of the invention may consist solely of indium, gallium, and aluminum.

Film-Formation Method of Amorphous Oxide Semiconductor Film

Figure 17A:
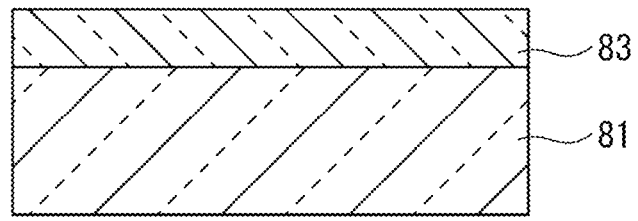
FIG. 17A is a vertical cross section showing an oxide semiconductor thin-film formed on a glass substrate.

The amorphous oxide semiconductor film according to an exemplary embodiment of the invention is formed through sputtering using the sintered oxide according to the exemplary embodiments of the invention (see FIG. 17A).

The amorphous oxide semiconductor film can be formed through, for instance, vapor deposition, ion-plating, pulse-laser deposition and the like instead of sputtering.

The atomic composition of the amorphous oxide semiconductor film according to an exemplary embodiment of the invention becomes the same as the atomic composition of the sputtering target (sintered oxide) used in forming the film.

A process for forming the amorphous oxide semiconductor film on a substrate through sputtering using the sputtering target obtained from the sintered oxide according to the exemplary embodiments of the invention will be described below.

Examples of applicable sputtering include DC sputtering, RF sputtering, AC sputtering, and pulse DC sputtering, any of which are capable of sputtering without causing abnormal electrical discharge.

The sputtering gas may be a mixture gas of argon and oxidative gas, examples of which include $O_2$, $CO_2$, $O_3$, and $H_2O$.

A thin-film formed by sputtering on a substrate can be kept amorphous under the conditions below even after the thin-film is annealed, whereby excellent semiconductor properties can be exhibited.

The annealing temperature is, for instance, 500 degrees C. or less, preferably in a range from 100 to 500 degrees C., further preferably in a range from 150 to 400 degrees C., especially preferably 250 to 400 degrees C. The annealing time is usually 0.01 to 5.0 hours, preferably 0.1 to 3.0 hours, more preferably 0.5 to 2.0 hours.

The atmosphere for annealing is, though not particularly limited, preferably atmospheric air or oxygen-circulation atmosphere in terms of carrier controllability, more preferably atmospheric air. During the annealing, a lamp annealing machine, laser annealing machine, thermal plasma machine, machine, contact heater or the like is usable under the presence or absence of oxygen.

Figure 17B:
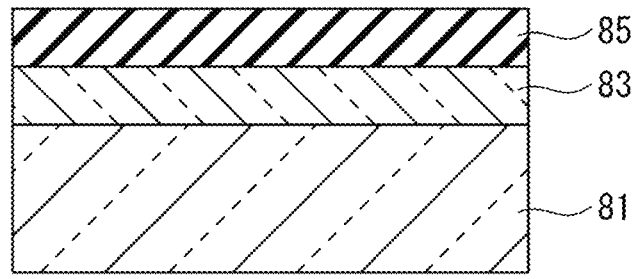
FIG. 17B illustrates an $SiO_2$ film formed on the oxide semiconductor thin-film shown in FIG. 17A.

The annealing (heat treatment) is preferably performed after a protection film covering the thin-film on the substrate is formed (see FIG. 17B).

Examples of the protection film include a film made of, for instance, $SiO_2$, $SiON$, $Al_2O_3$, $Ta_2O_5$, $TiO_2$, $MgO$, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTiO_3$, $BaTa_2O_6$, $SrTiO_3$ or the like. Among the above, the protection film is preferably made of $SiO_2$, $SiON$, $Al_2O_3$, $Y_2O_3$, $Hf_2O_3$, or $CaHfO_3$, more preferably $SiO_2$, or $Al_2O_3$. The number of oxygen in the above oxides is not necessarily the same as a stoichiometric ratio (for instance, representable by any of $SiO_2$ or $SiOx$). The protection film is adapted to serve as a protective insulation film.

The protection film is capable of being formed through plasma CVD or sputtering, preferably formed through sputtering in a rare-gas atmosphere containing oxygen.

The thickness of the protection film is suitably set as desired, for instance, in a range from 50 to 500 nm.

Thin-Film Transistor

An amorphous oxide semiconductor film according to an exemplary embodiment of the invention is suitably usable for a channel layer of the thin-film transistor.

The thin-film transistor according to the exemplary embodiment of the invention may be configured in any known manner as long as the thin-film transistor includes the amorphous oxide semiconductor film according to the exemplary embodiment of the invention as the channel layer. The thin-film transistor of the invention is suitably applicable to a display (e.g. liquid crystal display and organic EL display).

A film thickness of the channel layer in the thin-film transistor according to the exemplary embodiment of the invention is typically in a range from 10 to 300 nm, preferably from 20 to 250 nm.

The channel layer in the thin-film transistor according to the exemplary embodiment of the invention, which is usually used to provide an N-type region, is applicable in combination with various P-type semiconductors (e.g. P-type Si semiconductor, P-type oxide semiconductor, P-type organic semiconductor) to various semiconductor devices such as a PN junction transistor.

The thin-film transistor according to the exemplary embodiment of the invention is also applicable to various integrated circuits such as a field-effect transistor, logic circuit, memory circuit, and differential amplifier. In addition to the field-effect transistor, the thin-film transistor is applicable to an electrostatic inductive transistor, Schottky barrier transistor, Schottky diode, and resistor.

The thin-film transistor according to an exemplary embodiment of the invention may be constructed in any manner without limitation and may have known structure such as bottom-gate, bottom-contact, and top-contact structures.

Among the above, the bottom-gate structure is advantageous in view of higher performance than thin-film transistors of amorphous silicon and ZnO. The bottom-gate structure is also preferable for the adaptability in reducing the number of masks during the production process, which results in reduction in the production cost of large-size displays and the like.

The thin-film transistor according to the exemplary embodiment of the invention is suitably usable for a display.

Channel-etching bottom-gate thin-film transistors are especially preferable for use in large-size displays. The channel-etching bottom-gate thin-film transistors, which require a small number of photomasks in a photolithography process, allow the production of display panels at a low production cost. Especially, channel-etching bottom-gate and channel-etching top-contact thin-film transistors are preferable in terms of excellent performance (e.g. carrier mobility) and industrial applicability.

Figure 3:
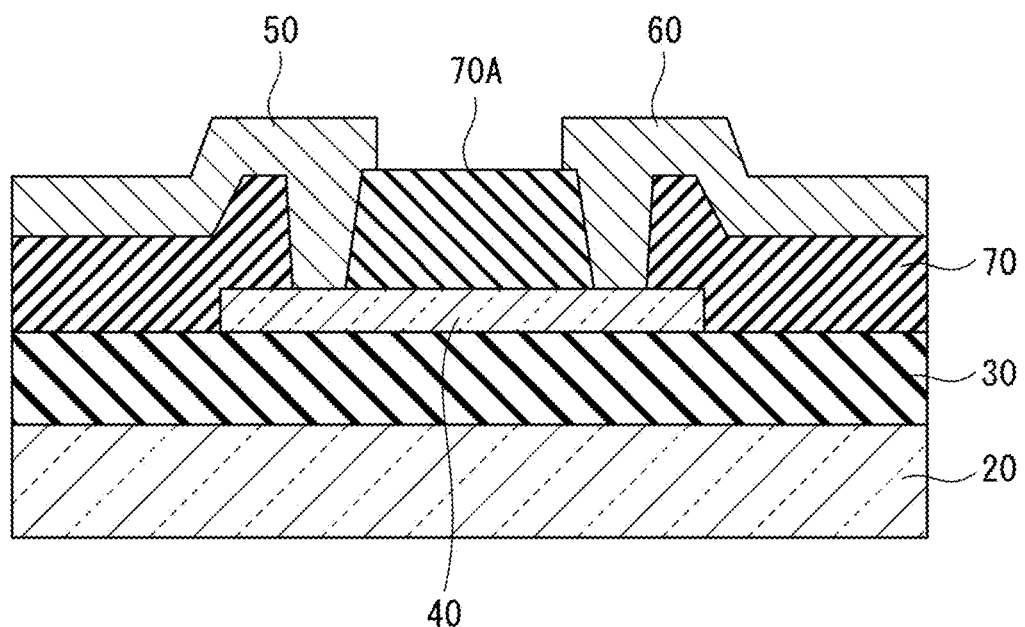
FIG. 3 is a vertical cross section showing a thin-film transistor according to an exemplary embodiment of the invention.
Figure 4:
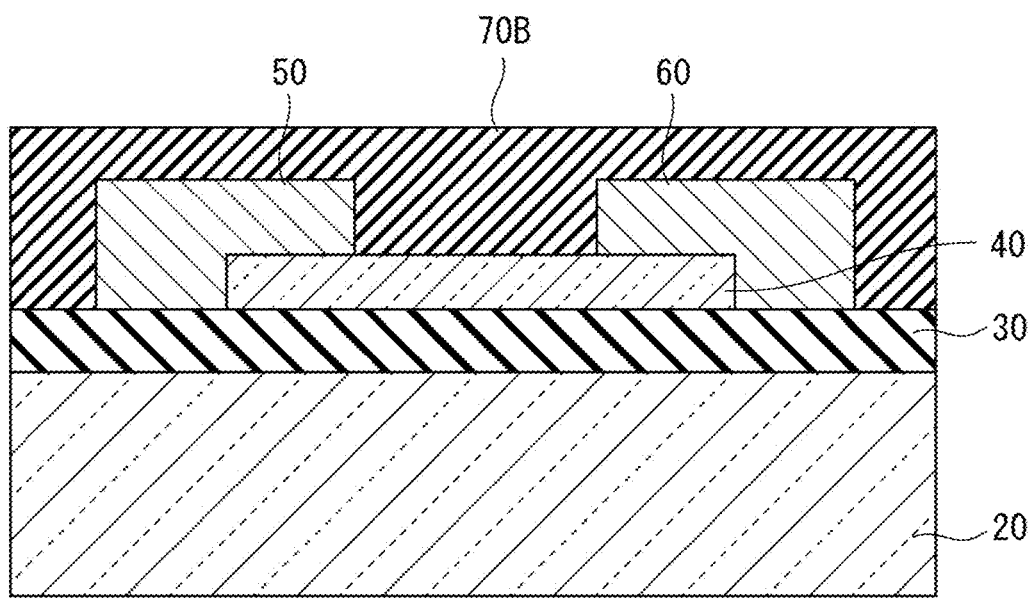
FIG. 4 is a vertical cross section showing a thin-film transistor according to another exemplary embodiment of the invention.

Specific examples of the thin-film transistor are shown in FIGS. 3 and 4.

As shown in FIG. 3, a thin-film transistor 100 includes a silicon wafer 20, a gate insulating film 30, an oxide semiconductor thin-film 40, a source electrode 50, a drain electrode 60, and interlayer insulating films 70, 70A.

The silicon wafer 20 defines a gate electrode. The gate insulating film 30, which is an insulation film for insulation between the gate electrode and the oxide semiconductor thin-film 40, is provided on the silicon wafer 20.

The oxide semiconductor thin-film 40 (channel layer) is provided on the gate insulating film 30. The oxide semiconductor thin-film 40 is the oxide semiconductor thin-film according to an exemplary embodiment of the invention.

The source electrode 50 and the drain electrode 60, which are conductive terminals for passing source current and drain current through the oxide semiconductor thin-film 40, are in contact with parts near respective ends of the oxide semiconductor thin-film 40.

The interlayer insulating film 70 is an insulation film for insulating parts other than the contact portions between the source electrode 50 (drain electrode 60) and the oxide semiconductor thin-film 40.

The interlayer insulating film 70A is another insulation film for insulating parts other than the contact portions between the source electrode 50 and drain electrode 60, and the oxide semiconductor thin-film 40. The interlayer insulating film 70A is also an insulation film for insulation between the source electrode 50 and the drain electrode 60, and also serves as a protection layer for the channel layer.

As shown in FIG. 4, the structure of a thin-film transistor 100A is substantially the same as the thin-film transistor 100, except that the source electrode 50 and the drain electrode 60 are in contact with both of the gate insulating film 30 and the oxide semiconductor thin-film 40, and that an interlayer insulating film 70B is integrally provided to cover the gate insulating film 30, the oxide semiconductor thin-film 40, the source electrode 50, and the drain electrode 60.

The material for the drain electrode 60, the source electrode 50 and the gate electrode are not particularly limited but may be selected from generally known materials. In the examples shown in FIGS. 3 and 4, the silicon wafer is used for the substrate. Though the silicon wafer also serves as an electrode, the material of the electrode is not necessarily silicon.

For instance, the electrode may be a transparent electrode made of, for instance, ITO (Indium Tin Oxide), IZO (Indium Zinc Oxide), ZnO, and $SnO_2$, a metal electrode made of Al, Ag, Cu, Cr, Ni, Mo, Au, Ti, Ta, or the like, a metal electrode made of an alloy containing the above metal elements, or a laminated electrode of layers made of the alloy.

The gate electrode shown in FIGS. 3 and 4 may be formed on a substrate made of glass or the like.

The material for the interlayer insulating films 70, 70A and 70B is not particularly limited but may be selected as desired from generally known materials. Specifically, the interlayer insulating films 70, 70A, 70B may be made of a compound such as $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $HfO_2$, $CaHfO_3$, $PbTiO_3$, $BaTa_2O_6$, $SrTiO_3$, $Sm_2O_3$, and AlN.

When the thin-film transistor according to the exemplary embodiment of the invention is a back-channel-etching (bottom-gate) thin-film transistor, it is preferable to provide a protection film on the drain electrode, the source electrode and the channel layer. The protection film enhances the durability against a long-term driving of the TFT. In a top-gate TFT, the gate insulating film is formed on, for instance, the channel layer.

The protection film or the insulation film can be formed, for instance, through a CVD process, which sometimes entails high-temperature treatment. The protection film or the insulation film often contains impurity gas immediately after being formed, and thus preferably subjected to a heat treatment (annealing). The heat treatment removes the impurity gas to provide a stable protection film or insulation film, and, consequently, highly durable TFT device.

With the use of the oxide semiconductor thin-film according to the exemplary embodiment of the invention, the TFT device is less likely to be affected by the temperature in the CVD process and the subsequent heat treatment. Accordingly, the stability of the TFT properties can be enhanced even when the protection film or the insulation film is formed.

Among the transistor properties, On/Off characteristics determine display performance of display devices. When the transistor is used as a switching device of liquid crystal, On/Off ratio is preferably six or more digits. OLED, which is current-driven and whose On-current is of importance, also preferably has six or more digits On/Off ratio.

The thin-film transistor according to the exemplary embodiment of the invention preferably has 1×10$^6$ or more On/Off ratio.

The On/Off ratio can be determined as a ratio [On current value/Off current value] of On current value (a value of Id when Vg=20 V) to Off current value (a value of Id when Vg=−10 V).

The carrier mobility in the TFT according to the exemplary embodiment of the invention is preferably 5 cm$^2$/Vs or more, more preferably 10 cm$^2$/Vs or more.

The saturation mobility is determined based on a transfer function when a 20 V drain voltage is applied. Specifically, the saturation mobility can be calculated by: plotting a graph of a transfer function Id–Vg; calculating transconductance (Gm) for each Vg; and calculating the saturation mobility using a formula in a saturated region. It should be noted Id represents a current between the source and drain electrodes, and Vg represents a gate voltage when the voltage Vd is applied between the source and drain electrodes.

A threshold voltage (Vth) is preferably in a range from −3.0 V to 3.0 V, more preferably from −2.0 V to 2.0 V, further preferably from −1.0 V to 1.0 V. At the threshold voltage (Vth) of −3.0 V or more, a thin-film transistor with a high carrier mobility can be provided. At the threshold voltage (Vth) of 3.0 V or less, a thin-film transistor with small off current and a large On/Off ratio can be provided.

The threshold voltage (Vth) is defined as Vg at Id=10$^{-9}$ A based on the graph of the transfer function.

The On/Off ratio is preferably in a range from 10$^6$ to 10$^{12}$, more preferably from 10$^7$ to 10$^{11}$, further preferably from 10$^8$ to 10$^{10}$. At the On/Off ratio of 10$^6$ or more, a liquid crystal display can be driven. At the On/Off ratio of 10$^{12}$ or less, an organic EL device with a large contrast can be driven. Further, the off current can be set at 10$^{-11}$ A or less, allowing an increase in image-holding time and improvement in sensitivity when the present transistor is used for a transfer transistor or a reset transistor of a CMOS image sensor.

Quantum-Tunneling Field-Effect Transistor

The oxide semiconductor thin-film according to the exemplary embodiment of the invention is usable for a quantum-tunneling Field-Effect Transistor (FET).

Figure 5:
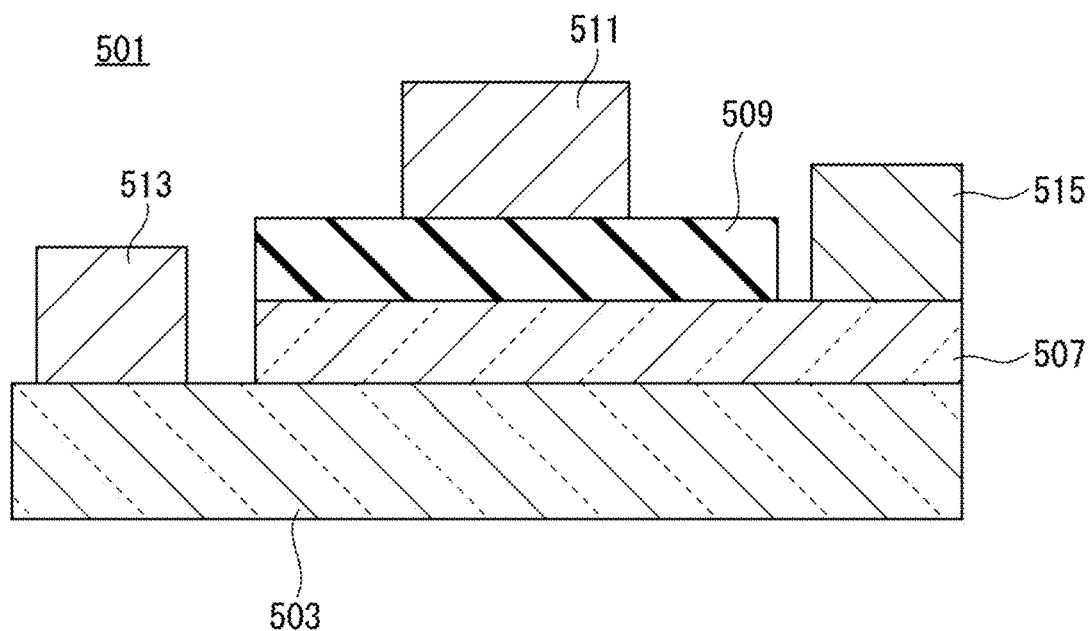
FIG. 5 is a vertical cross section showing a quantum-tunneling field-effect transistor according to an exemplary embodiment of the invention.

FIG. 5 is a schematic illustration (vertical cross section) of a quantum-tunneling FET (Field-Effect Transistor) according to an exemplary embodiment.

A quantum-tunneling field-effect transistor 501 includes a p-type semiconductor layer 503, an n-type semiconductor layer 507, a gate insulating film 509, a gate electrode 511, a source electrode 513, and a drain electrode 515.

The p-type semiconductor layer 503, the n-type semiconductor layer 507, the gate insulating film 509, and the gate electrode 511 are layered in this order.

The source electrode 513 is provided on the p-type semiconductor layer 503. The drain electrode 515 is provided on the n-type semiconductor layer 507.

The p-type semiconductor layer 503 is a layer of a p-type IV group semiconductor layer, which is a p-type silicon layer in the exemplary embodiment.

The n-type semiconductor layer 507 is an n-type oxide semiconductor thin-film according to the exemplary embodiment. The source electrode 513 and the drain electrode 515 are conductive films.

Though not shown in FIG. 5, an insulation layer may be provided on the p-type semiconductor layer 503. In this case, the p-type semiconductor layer 503 and the n-type semiconductor layer 507 are connected through a contact hole(s) defined by partially removing the insulation layer.

Though not shown in FIG. 5, the quantum-tunneling field-effect transistor 501 may be provided with an interlayer insulating film covering an upper side of the quantum-tunneling field-effect transistor 501.

The quantum-tunneling field-effect transistor 501 is a current-switching quantum-tunneling FET (Field-Effect Transistor) for controlling the electric current tunneled through an energy barrier formed by the p-type semiconductor layer 503 and the n-type semiconductor layer 507 using a voltage applied to the gate electrode 511. With this structure, the band gap of the oxide semiconductor of the n-type semiconductor layer 507 can be increased, thereby decreasing the off current.

Figure 6:
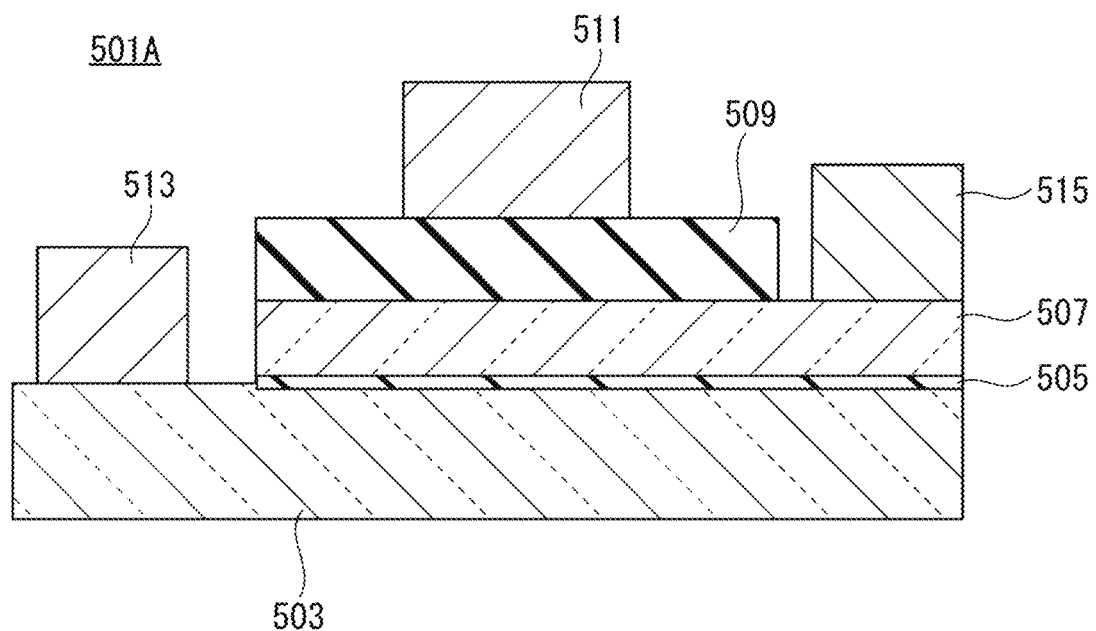
FIG. 6 is a vertical cross section showing a quantum-tunneling field-effect transistor according to another exemplary embodiment.

FIG. 6 is a schematic illustration (vertical cross section) of a quantum-tunneling field-effect transistor 501A according to another exemplary embodiment.

The structure of the quantum-tunneling field-effect transistor 501A is the same as the structure of the quantum-tunneling field-effect transistor 501 except that a silicon oxide layer 505 is interposed between the p-type semiconductor layer 503 and the n-type semiconductor layer 507. The off current can be reduced by the presence of the silicon oxide layer.

The thickness of the silicon oxide layer 505 is preferably 10 nm or less. At the thickness of 10 nm or less, the tunnel current securely passes through the energy barrier and the energy barrier can be securely formed with a constant barrier height, preventing the decrease or change in the tunneling current. The thickness is preferably 8 nm or less, more preferably 5 nm or less, further preferably 3 nm or less, and especially preferably 1 nm or less.

Figure 7:
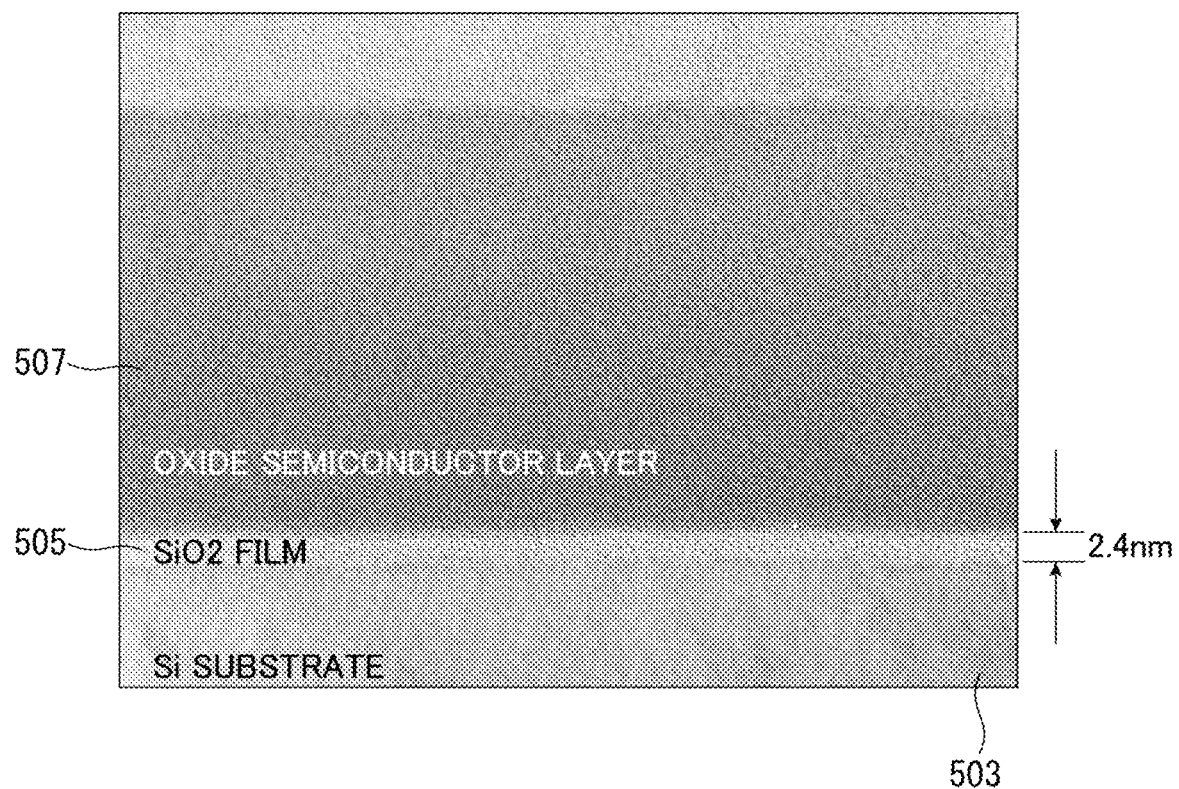
FIG. 7 is a photograph taken by a TEM (Transmission Electron Microscope) showing a silicon oxide layer between a p-type semiconductor layer and an n-type semiconductor layer shown in FIG. 6.

FIG. 7 is a TEM photograph showing the silicon oxide layer 505 between the p-type semiconductor layer 503 and the n-type semiconductor layer 507.

The n-type semiconductor layer 507 in both of the quantum-tunneling field-effect transistors 501 and 501A is an n-type oxide semiconductor.

The oxide semiconductor of the n-type semiconductor layer 507 may be amorphous. The amorphous oxide semiconductor can be etched using an organic acid (e.g. oxalic acid) at a large difference in etching rate from the other layer(s), so that the etching process can be favorably performed without any influence on the metal layer (e.g. wiring).

The oxide semiconductor of the n-type semiconductor layer 507 may alternatively be crystalline. The crystalline oxide semiconductor exhibits a larger band gap than the amorphous oxide semiconductor, so that the off current can be reduced. Further, since the work function can be increased, the control over the current tunneled through the energy barrier formed by the p-type IV group semiconductor material and the n-type semiconductor layer 507 can be facilitated.

A non-limiting example of the production method of the quantum-tunneling field-effect transistor 501 will be described below.

Figure 8A:
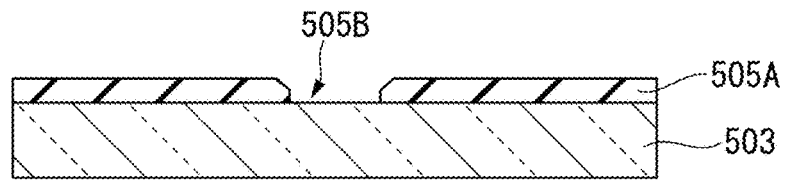
FIG. 8A is a vertical cross section showing a step in the production process of the quantum-tunneling field-effect transistor.

Initially, as shown in FIG. 8A, an insulation film 505A is formed on the p-type semiconductor layer 503. Then, a part of the insulation film 505A is removed by etching or the like to form a contact hole 505B.

Figure 8B:
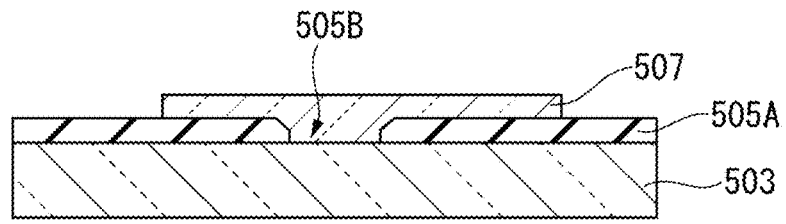
FIG. 8B is a vertical cross section showing another step in the production process of the quantum-tunneling field-effect transistor.

Subsequently, as shown in FIG. 8B, the n-type semiconductor layer 507 is formed on the p-type semiconductor layer 503 and the insulation film 505A. At this time, the p-type semiconductor layer 503 and the n-type semiconductor layer 507 are connected through the contact hole 505B.

Figure 8C:
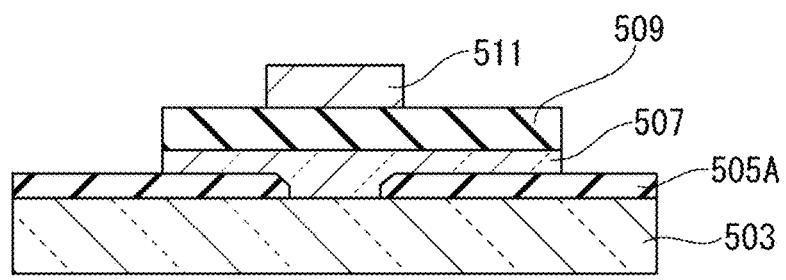
FIG. 8C is a vertical cross section showing still another step in the production process of the quantum-tunneling field-effect transistor.

Subsequently, as shown in FIG. 8C, the gate insulating film 509 and the gate electrode 511 are formed in this order on the n-type semiconductor layer 507.

Figure 8D:
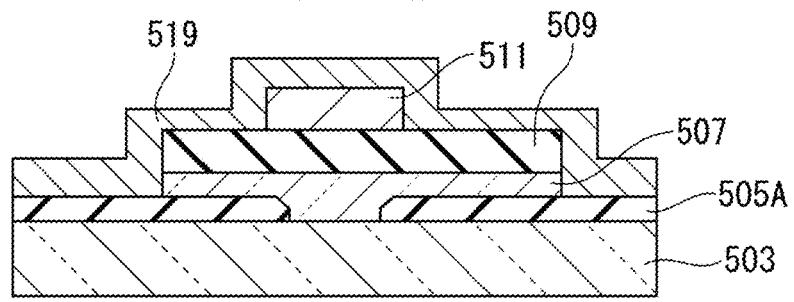
FIG. 8D is a vertical cross section showing a further step in the production process of the quantum-tunneling field-effect transistor.

Then, as shown in FIG. 8D, an interlayer insulating film 519 is formed to cover the insulation film 505A, the n-type semiconductor layer 507, the gate insulating film 509 and the gate electrode 511.

Figure 8E:
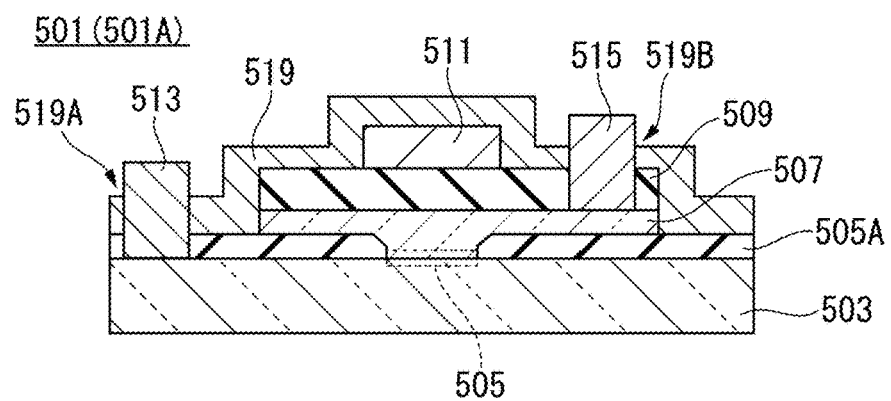
FIG. 8E is a vertical cross section showing a still further step in the production process of the quantum-tunneling field-effect transistor.

Next, as shown in FIG. 8E, the insulation film 505A on the p-type semiconductor layer 503 and the interlayer insulating film 519 are partially removed to form a contact hole 519A, in which the source electrode 513 is provided.

Further, as shown in FIG. 8E, the gate insulating film 509 on the n-type semiconductor layer 507 and the interlayer insulating film 519 are partially removed to form a contact hole 519B, in which the drain electrode 515 is formed.

The quantum-tunneling field-effect transistor 501 is produced through the above process.

It should be noted that the silicon oxide layer 505 between the p-type semiconductor layer 503 and the n-type semiconductor layer 507 can be formed by applying a heat treatment at a temperature ranging from 150 degrees C. to 600 degrees C. after the n-type semiconductor layer 507 is formed on the p-type semiconductor layer 503. The quantum-tunneling field-effect transistor 501A can be produced through the process including the above additional step.

The thin-film transistor according to the exemplary embodiment of the invention is preferably a doped-channel thin-film transistor. The doped-channel transistor refers to a transistor whose carrier in the channel is appropriately controlled not by the oxygen vacancy, which is easily affected by external stimuli such as atmosphere and temperature, but by an n-type doping, for achieving both of high carrier mobility and high reliability.

Usage of Thin-Film Transistor

The thin-film transistor according to the exemplary embodiment of the invention is also capable of being embodied as various integrated circuits such as a field-effect transistor, logic circuit, memory circuit, and differential amplifier, which are applicable to electronic devices. Further, the thin-film transistor according to the exemplary embodiment of the invention is also applicable to an electrostatic inductive transistor, Schottky barrier transistor, Schottky diode, and resistor, in addition to the field-effect transistor.

The thin-film transistor according to the exemplary embodiment of the invention is suitably usable for a display, solid-state image sensor, and the like. A display and a solid-state image sensor incorporating the thin-film transistor according to the exemplary embodiment of the invention will be described below.

Initially, a display incorporating the thin-film transistor according to the exemplary embodiment of the invention will be described with reference to FIG. 9.

Figure 9A:
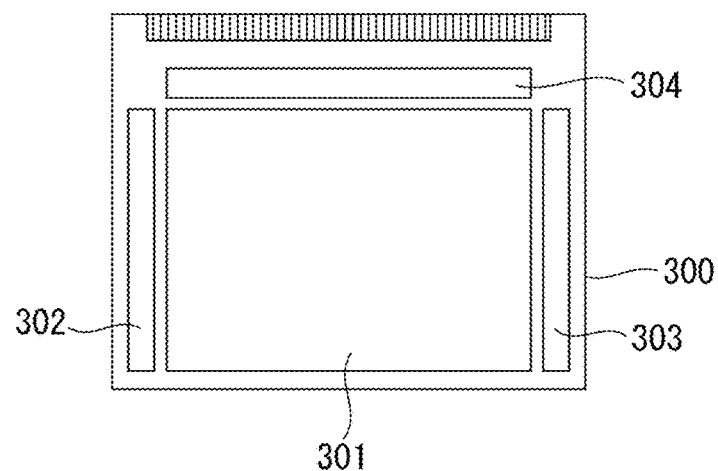
FIG. 9A is a top plan showing a display using the thin-film transistor according to an exemplary embodiment of the invention.
Figure 9B:
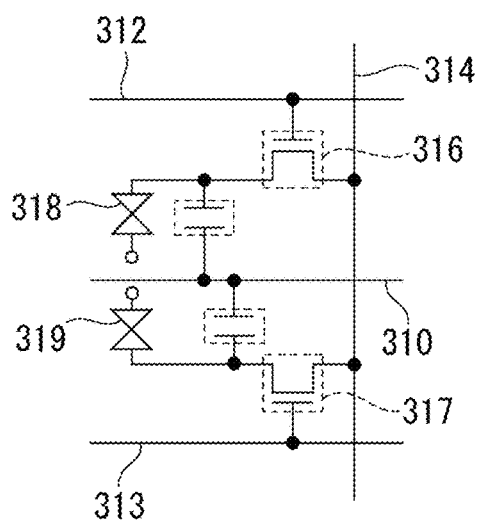
FIG. 9B illustrates a circuit of a pixel unit applicable to a pixel of a VA liquid crystal display.

FIG. 9A is a top plan view of a display according to an exemplary embodiment of the invention. FIG. 9B is a circuit diagram showing a circuit of a pixel unit in a form of a liquid crystal device of the display according to the exemplary embodiment of the invention. FIG. 9B is a circuit diagram showing another circuit of a pixel unit in a form of an organic EL device of the display according to the exemplary embodiment of the invention.

The transistor in the pixel unit may be the thin-film transistor according to the exemplary embodiment of the invention. The thin-film transistor according to the exemplary embodiment of the invention is easily made into an n-channel type. Accordingly, a part of the drive circuit capable of being provided by an n-channel transistor is formed on the same substrate as the transistor of the pixel unit. A highly reliable display can be provided using the thin-film transistor of the exemplary embodiment for the pixel unit and/or the drive circuit.

FIG. 9A is a top plan view showing an example of an active matrix display. The display includes a substrate 300, and a pixel unit 301, a first scan line drive circuit 302, a second scan line drive circuit 303, and a signal line drive circuit 304 formed on the substrate 300. Multiple signal lines extend from the signal line drive circuit 304 to the pixel unit 301. Multiple scan lines extend from the first scan line drive circuit 302 and the second scan line drive circuit 303 to the pixel unit 301. Pixels each including a display element are provided in a matrix at intersections of the scan lines and the signal lines. The substrate 300 of the display is connected to a timing controller (controller, also referred to as a control IC) through a connector such as an FPC (Flexible Printed Circuit).

As shown in FIG. 9A, the first scan line drive circuit 302, the second scan line drive circuit 303, and the signal line drive circuit 304 are provided on the same substrate 300 as the pixel unit 301. Such an arrangement results in reduction in the number of external component (e.g. drive circuit) and, consequently, reduction in production cost. In addition, when the drive circuit is provided outside the substrate 300, the lines have to be extended and the connection between the lines increases. With the drive circuit being provided on the same substrate 300, the number of connections between the lines can be reduced, thereby improving the reliability and yield rate.

An example of a pixel circuit is shown in FIG. 9B. FIG. 9B shows a circuit of a pixel unit applicable to a pixel unit of a VA liquid crystal display.

The circuit of the pixel unit is applicable to a device having a plurality of pixel electrodes in one pixel. The pixel electrodes are each connected to different transistors, whereby each of the transistors is drivable in accordance with a different gate signal. Thus, the signals to be applied to the respective pixel electrodes of a multi-domain structure can be independently controlled.

A gate line 312 of a transistor 316 and a gate line 313 of a transistor 317 are separated so that different gate signals are inputted thereto. In contrast, a source electrode or drain electrode 314 serving as a data line is common to the transistors 316 and 317. The transistors 316 and 317 may be the transistor according to the exemplary embodiment of the invention. A highly reliable liquid crystal display can be thereby provided.

First and second pixel electrodes are electrically connected to the transistors 316 and 317, respectively. The first pixel electrode is separated from the second pixel electrode. Shapes of the first and second pixel electrodes are not particularly limited. For instance, the first pixel electrode may be V-shaped.

Gate electrodes of the transistors 316 and 317 are connected with the gate lines 312 and 313, respectively. Different gate signals can be inputted to the gate lines 312 and 313 so that the transistors 316 and 317 are operated at different timings, thereby controlling orientation of the liquid crystal.

A capacity line 310, a gate insulating film serving as a dielectric, and a capacity electrode electrically connected with the first pixel electrode or the second pixel electrode may be provided to define a holding capacity.

In a multi-domain structure, first and second liquid crystal devices 318 and 319 are provided in one pixel. The first liquid crystal device 318 includes the first pixel electrode, an opposing electrode, and a liquid crystal layer interposed between the first pixel electrode and the opposing electrode. The second liquid crystal device 319 includes the second pixel electrode, an opposing electrode, and a liquid crystal layer interposed between the second pixel electrode and the opposing electrode.

The pixel unit is not necessarily arranged as shown in FIG. 9B. The pixel unit shown in FIG. 9B may additionally include a switch, a resistor, a capacitor, a transistor, a sensor, and/or a logic circuit.

Figure 9C:
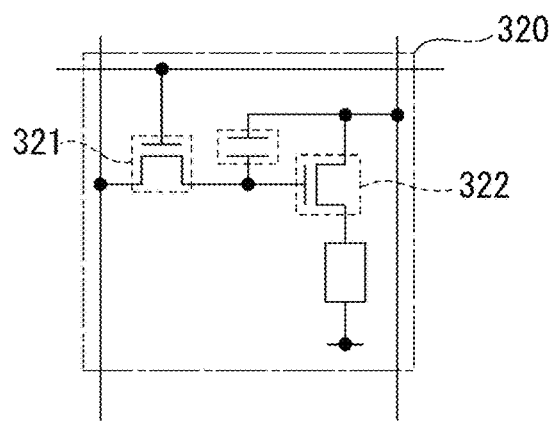
FIG. 9C illustrates a circuit of a pixel unit in a display using an organic EL device.

Another example of the pixel circuit is shown in FIG. 9C. Illustrated is a structure of a pixel unit in a display using an organic EL device.

FIG. 9C illustrates an applicable example of a circuit of a pixel unit 320. In this example, two n-channel transistors are used in one pixel. The oxide semiconductor film according to the exemplary embodiment of the invention is usable for a channel-formation region in the n-channel transistor. The circuit of the pixel unit can be driven in accordance with digital pulse width modulation control.

A switching transistor 321 and a drive transistor 322 may be the thin-film transistor according to the exemplary embodiment of the invention. A highly reliable organic EL display can be thereby provided.

The circuit of the pixel unit is not necessarily arranged as shown in FIG. 9C. The circuit of the pixel unit shown in FIG. 9C may additionally include a switch, a resistor, a capacitor, a sensor, a transistor, and/or a logic circuit.

The thin-film transistor according to the exemplary embodiment of the invention used in a display has been described above.

Next, a solid-state image sensor incorporating the thin-film transistor according to the exemplary embodiment of the invention will be described with reference to FIG. 10.

CMOS (Complementary Metal Oxide Semiconductor) image sensor is a solid-state image sensor including a signal charge accumulator for holding an electric potential, and an amplification transistor for transferring (outputting) the electric potential to a vertical output line. When the signal charge accumulator is charged or discharged by a possible leak current from the reset transistor and/or the transfer transistor of the CMOS image sensor, the electric potential of the signal charge accumulator changes. The change in the electric potential of the signal charge accumulator results in the change in the electric potential of the amplification transistor (i.e. shift from a desired value), deteriorating the quality of the captured image.

An effect of the thin-film transistor according to the exemplary embodiment of the invention incorporated in the reset transistor and transfer transistor of the CMOS image sensor will be described below. The amplification transistor may be any one of the thin-film transistor or a bulk transistor.

Figure 10:
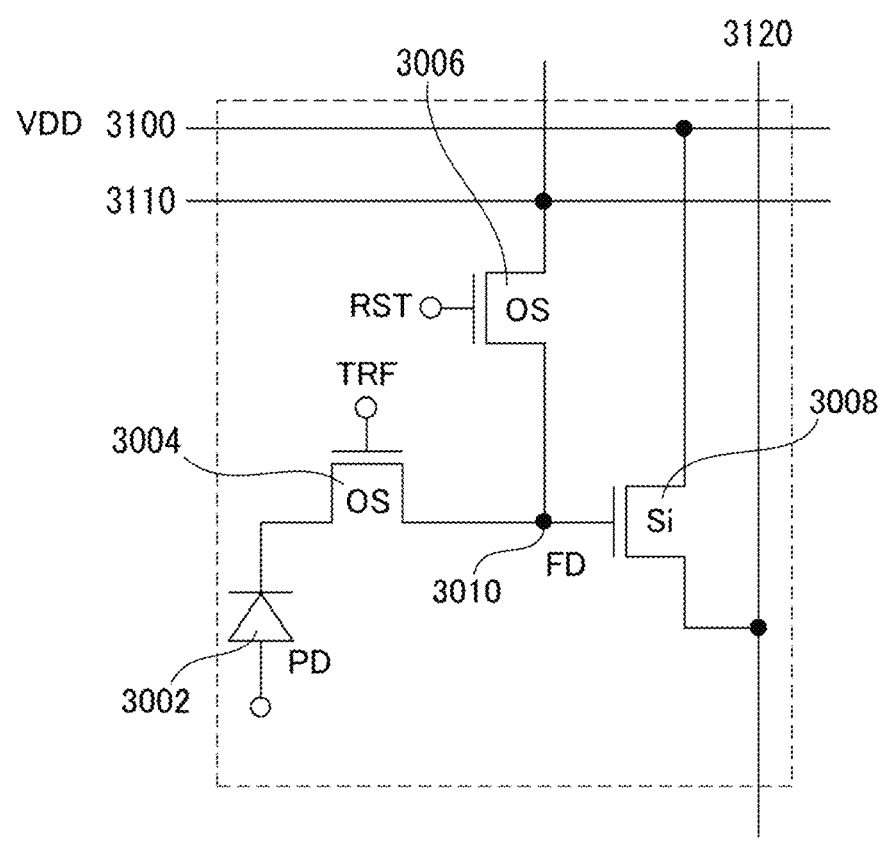
FIG. 10 illustrates a circuit of a pixel unit of a solid-state image sensor using a thin-film transistor according to an exemplary embodiment of the invention.

FIG. 10 illustrates an exemplary arrangement of the CMOS image sensor. The pixel includes a photodiode 3002 (photoelectric converter), a transfer transistor 3004, a reset transistor 3006, an amplification transistor 3008, and various lines. A plurality of the pixels are arranged in a matrix to form the sensor. A selector transistor may be electrically connected to the amplification transistor 3008. The characters in the transistor signs each represent a preferable material to be used for the transistors, where "OS" represents Oxide Semiconductor and "Si" represents silicon. The same applies to the other drawing(s).

The photodiode 3002 is connected to a source of the transfer transistor 3004. A signal charge accumulator 3010 (also referred to as FD (Floating Diffusion)) is provided to a drain of the transfer transistor 3004. The source of the reset transistor 3006 and the gate of the amplification transistor 3008 are connected to the signal charge accumulator 3010. A reset power line 3110 may be omitted in other embodiments. For instance, the drain of the reset transistor 3006 may be connected with a power line 3100 or a vertical output line 3120 instead of the reset power line 3110.

The oxide semiconductor film according to the exemplary embodiment of the invention, which may be made of the same material as the oxide semiconductor film used for the transfer transistor 3004 and the reset transistor 3006, may be used in the photodiode 3002.

The thin-film transistor according to the exemplary embodiment of the invention used in a solid-state image sensor has been described above.

EXAMPLES

An aspect(s) of the invention will be described below with reference to Examples and Comparatives. It should however be noted that the scope of the invention is not limited to Examples.

Preparation of Sintered Oxide

Examples 1 to 3

Powders of gallium oxide, aluminum oxide, and indium oxide were weighed in an atomic ratio as shown in Table 1, which were put in a polyethylene pot and mixed/pulverized using a dry ball mill for 72 hours to prepare a mixture powder.

The mixture powder was put in a die and pressed at a pressure of 500 kg/cm$^2$ to prepare a molding body. The molding body was compacted through CIP at a pressure of 2000 kg/cm$^2$. Next, the molding body was placed in an atmospheric-pressure sintering furnace and was kept at 350 degrees C. for 3 hours. Subsequently, the temperature inside the furnace was raised at a temperature increase rate of 100 degrees C./hr., was kept at 1450 degrees C. for 32 hours, and was left and cooled to obtain a sintered oxide.

The following items of the obtained sintered oxide were evaluated. The results are shown in Table 1.
Property Evaluation of Sintered Oxide
(1) XRD Measurement XRD (X-Ray Diffraction) of the obtained sintered oxide was measured using an X-ray diffractiometer Smartlab under the conditions below. The resultant XRD chart was analyzed using JADE6 to determine the crystalline phase in the sintered oxide.

Machine: Smartlab (manufactured by Rigaku Corporation)
X-ray: Cu-K α ray (wavelength $1.5418 \times 10^{-10}$ m)
2θ-θ Reflection method, Continuous Scan (2.0 degrees/min.)
Sampling interval: 0.02 degrees
Slit DS (Divergence Slit), SS (Scattering Slit), RS (Receiving Slit): 1 mm XRD charts of the sintered oxide prepared in Examples 1 to 3 are shown in FIGS. 11 to 13, respectively.

Figure 11:
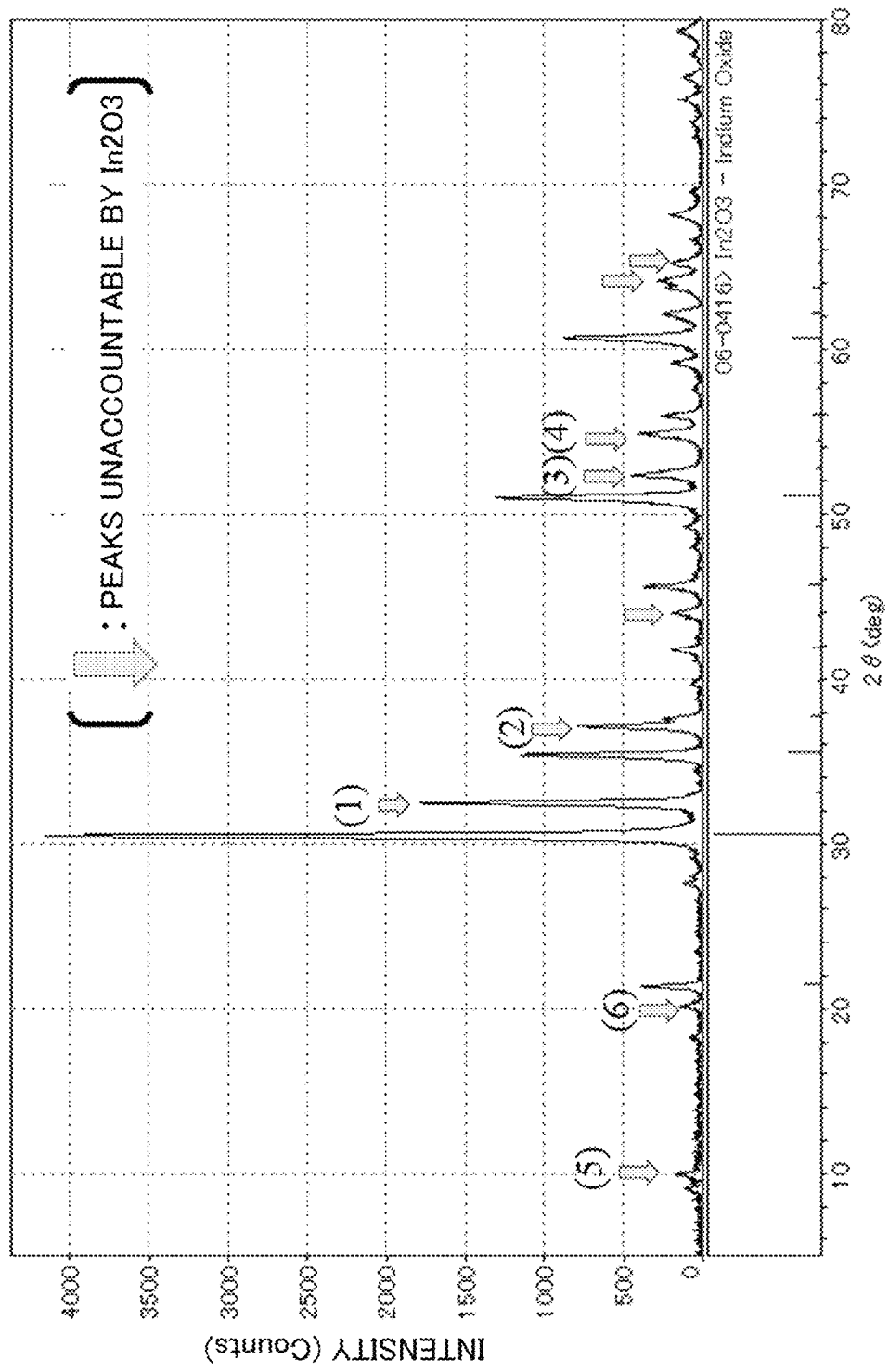
FIG. 11 is an XRD chart of a sintered oxide prepared in Example 1.
Figure 12:
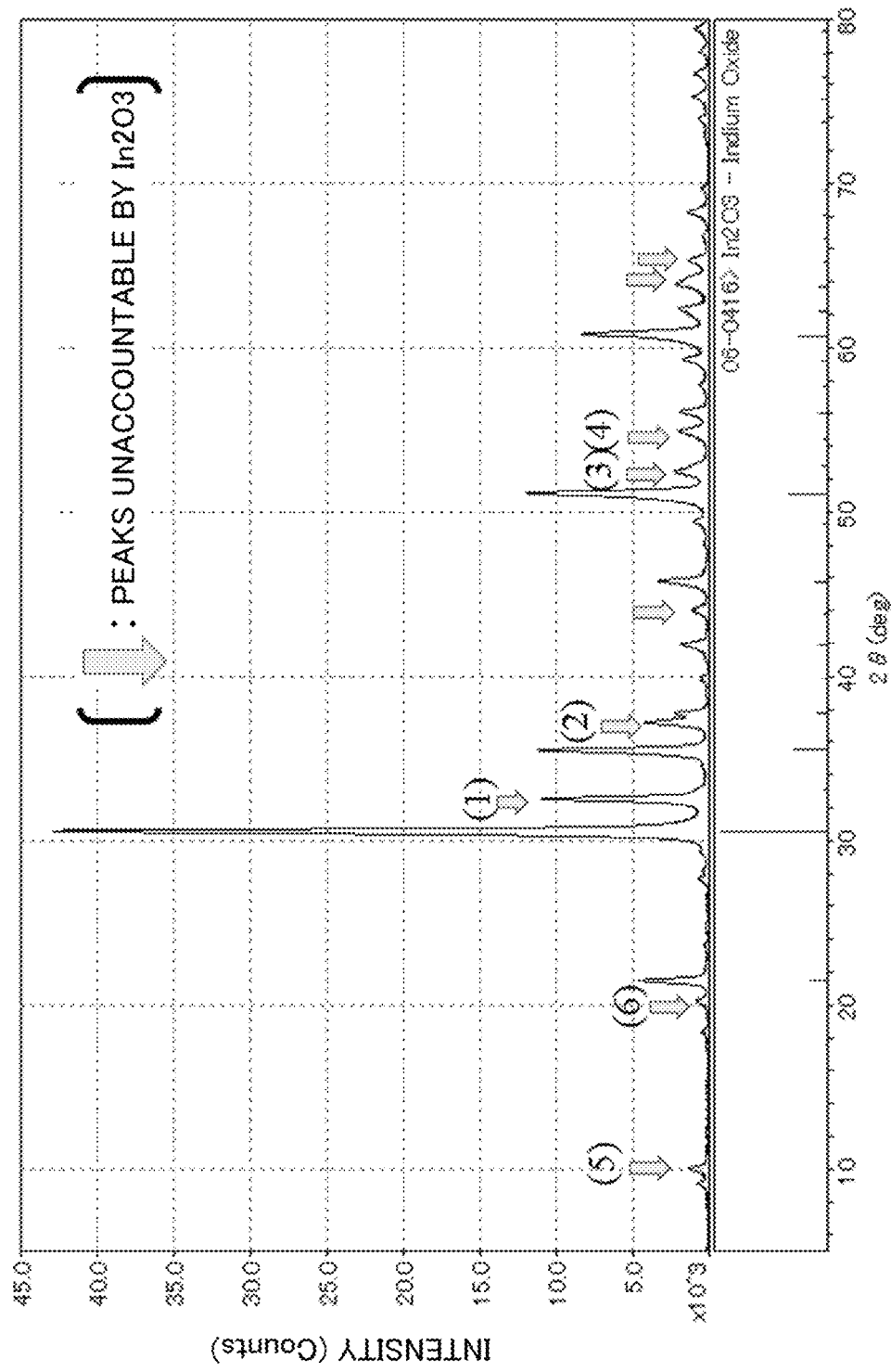
FIG. 12 is an XRD chart of a sintered oxide prepared in Example 2.
Figure 13:
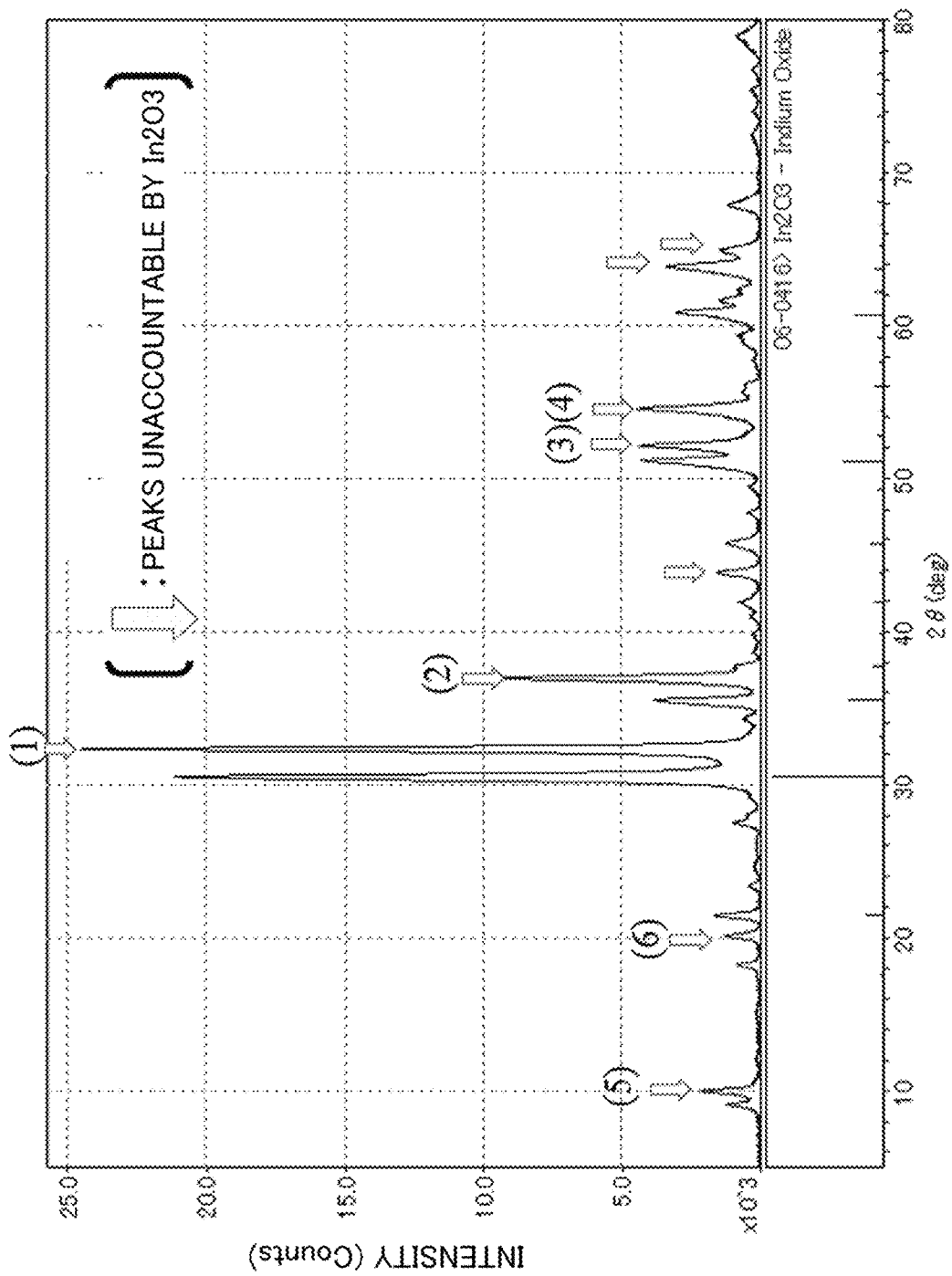
FIG. 13 is an XRD chart of a sintered oxide prepared in Example 3.
Figure 14A:
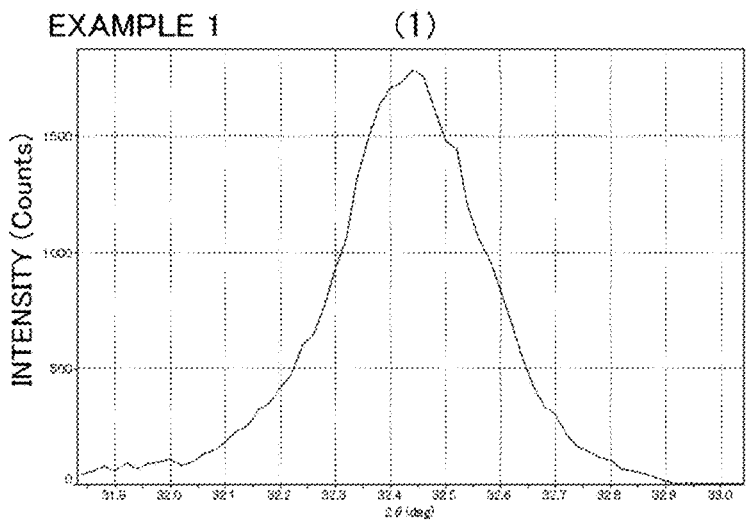
FIG. 14A is an enlarged view of a peak (1) after peaks of $In_2O_3$ are removed from the XRD chart shown in FIG. 11.
Figure 14B:
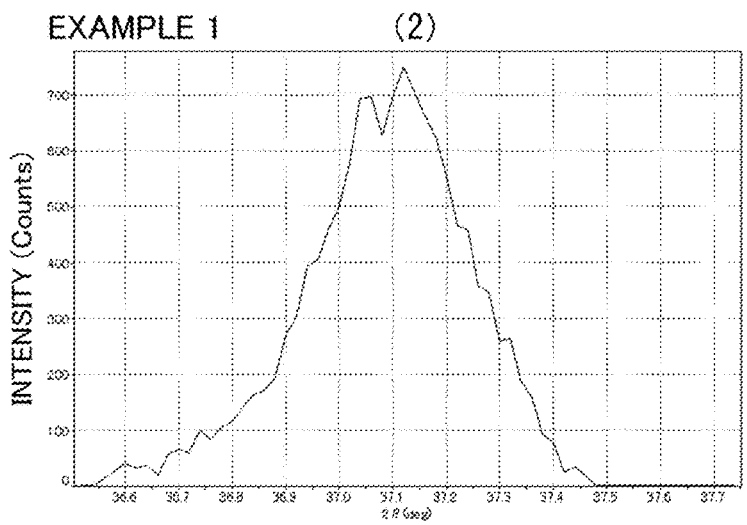
FIG. 14B is an enlarged view of a peak (2) after the peaks of $In_2O_3$ are removed from the XRD chart shown in FIG. 11.
Figure 14C:
FIG. 14C is an enlarged view of a peak (3) after the peaks of $In_2O_3$ are removed from the XRD chart shown in FIG. 11.
Figure 14D:
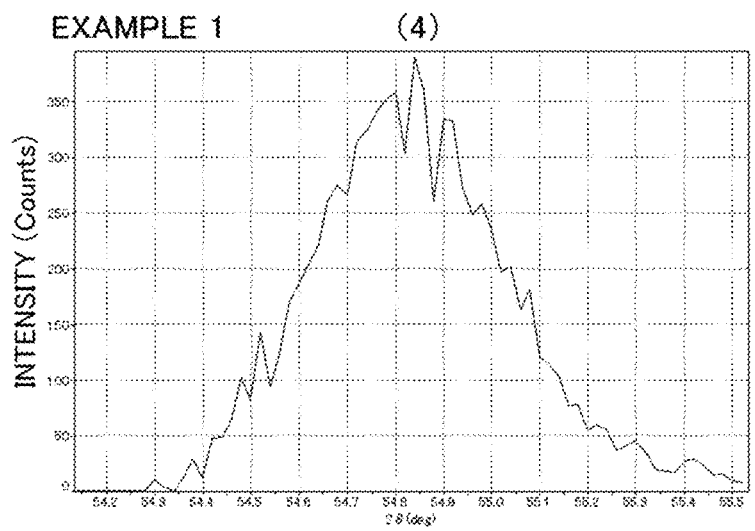
FIG. 14D is an enlarged view of a peak (4) after the peaks of $In_2O_3$ are removed from the XRD chart shown in FIG. 11.
Figure 14E:
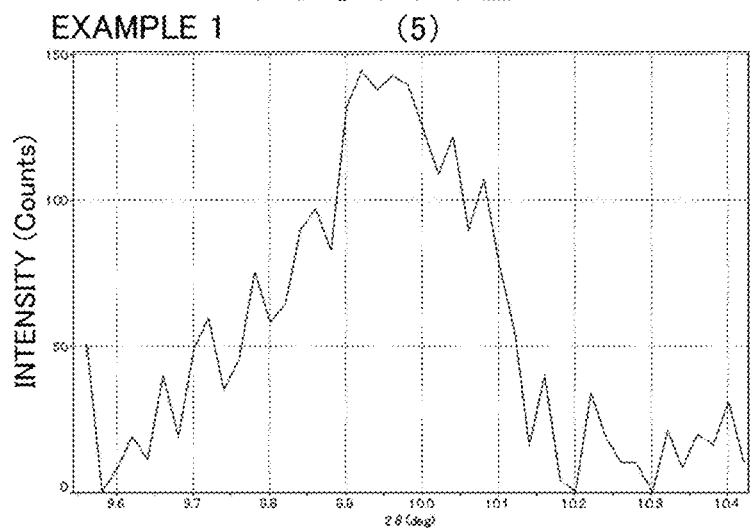
FIG. 14E is an enlarged view of a peak (5) after the peaks of $In_2O_3$ are removed from the XRD chart shown in FIG. 11.
Figure 14F:
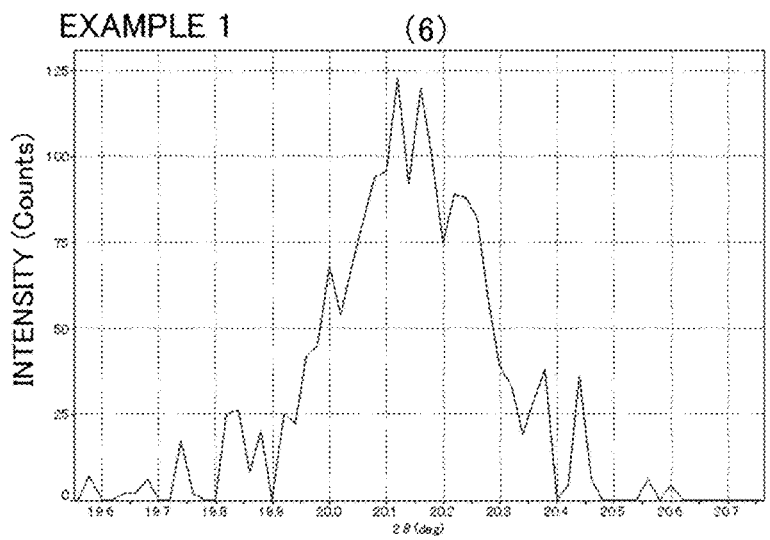
FIG. 14F is an enlarged view of a peak (6) after the peaks of $In_2O_3$ are removed from the XRD chart shown in FIG. 11.
Figure 15A:
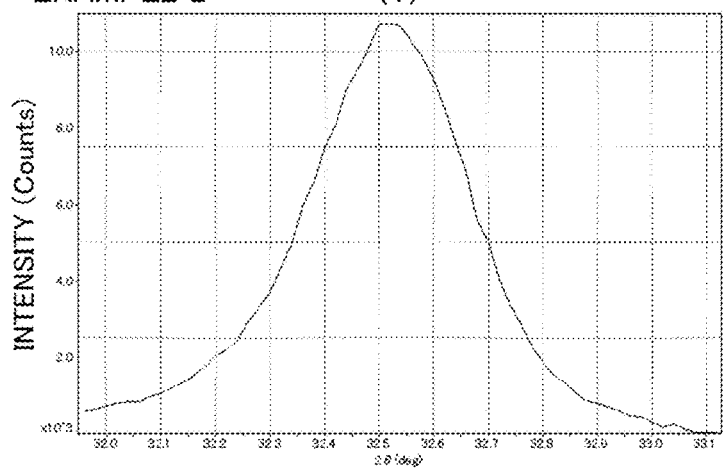
FIG. 15A is an enlarged view of a peak (1) after the peaks of $In_2O_3$ are removed from the XRD chart shown in FIG. 12.
Figure 15B:
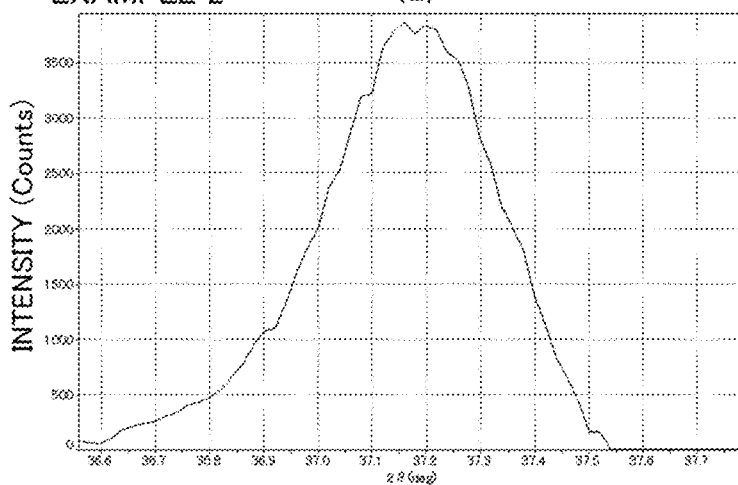
FIG. 15B is an enlarged view of a peak (2) after the peaks of $In_2O_3$ are removed from the XRD chart shown in FIG. 12.
Figure 15C:
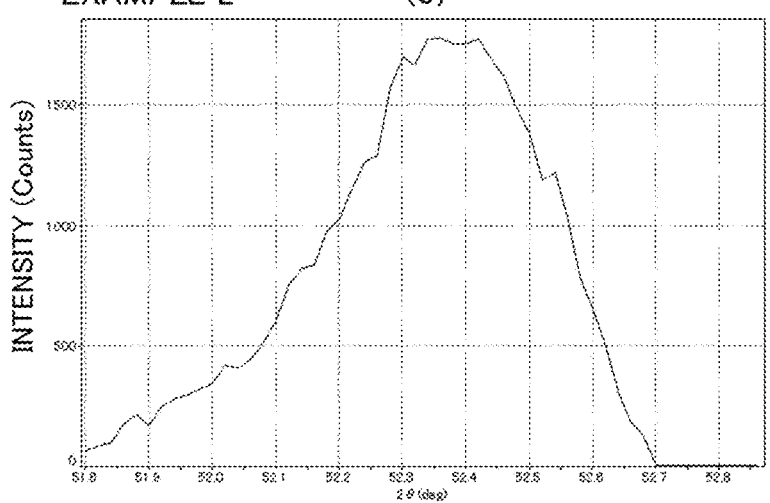
FIG. 15C is an enlarged view of a peak (3) after the peaks of $In_2O_3$ are removed from the XRD chart shown in FIG. 12.
Figure 15D:
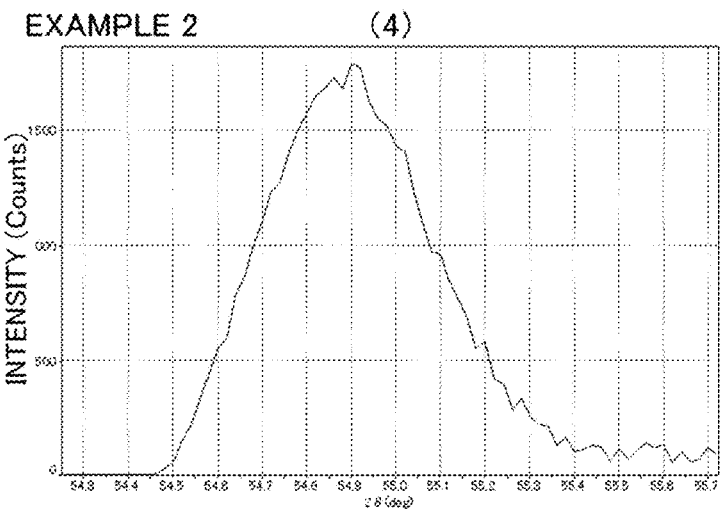
FIG. 15D is an enlarged view of a peak (4) after the peaks of $In_2O_3$ are removed from the XRD chart shown in FIG. 12.
Figure 15E:
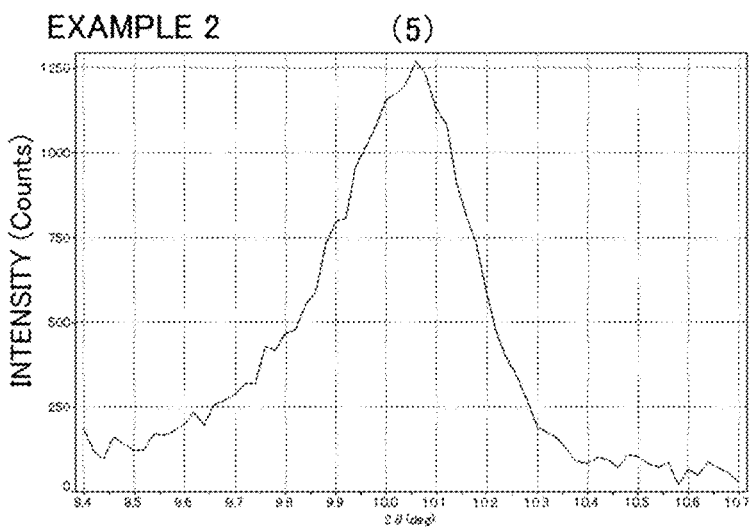
FIG. 15E is an enlarged view of a peak (5) after the peaks of $In_2O_3$ are removed from the XRD chart shown in FIG. 12.
Figure 15F:
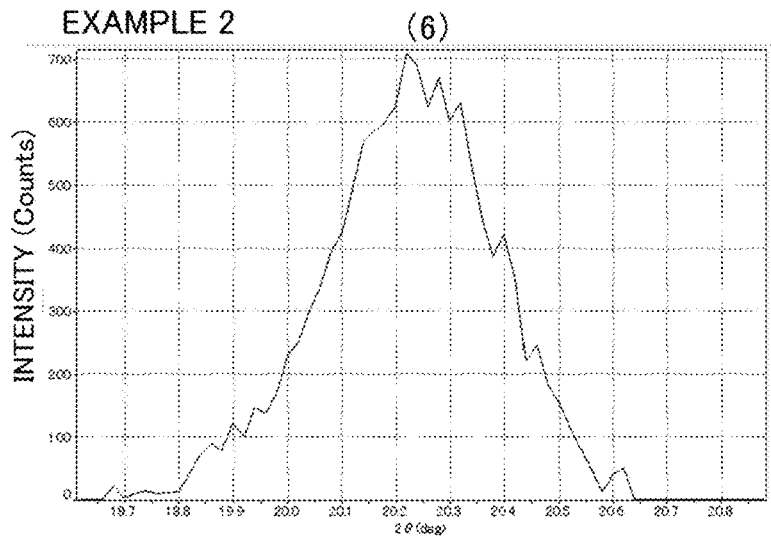
FIG. 15F is an enlarged view of a peak (6) after the peaks of $In_2O_3$ are removed from the XRD chart shown in FIG. 12.
Figure 16A:
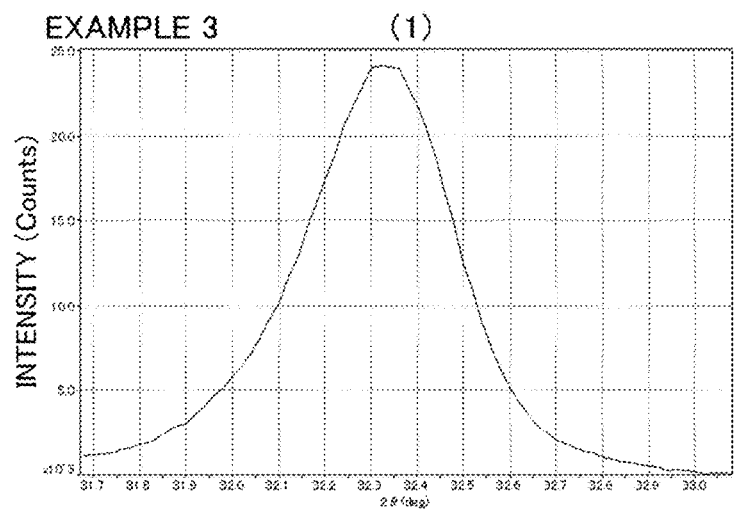
FIG. 16A is an enlarged view of a peak (1) after the peaks of $In_2O_3$ are removed from the XRD chart shown in FIG. 13.
Figure 16B:
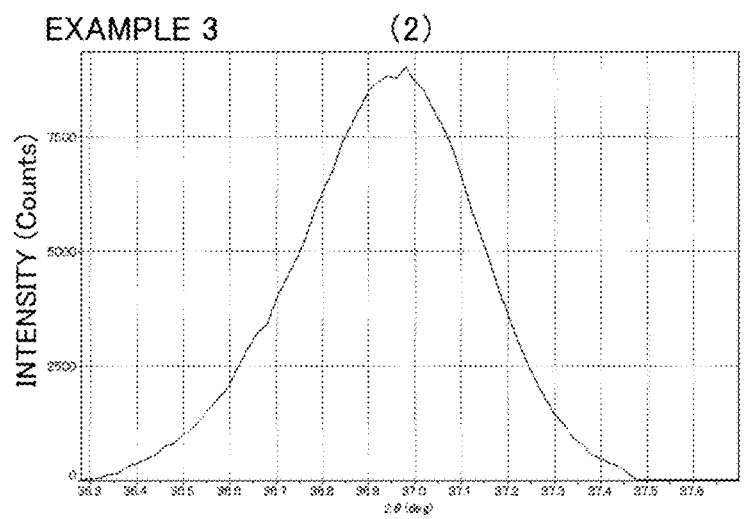
FIG. 16B is an enlarged view of a peak (2) after the peaks of $In_2O_3$ are removed from the XRD chart shown in FIG. 13.
Figure 16C:
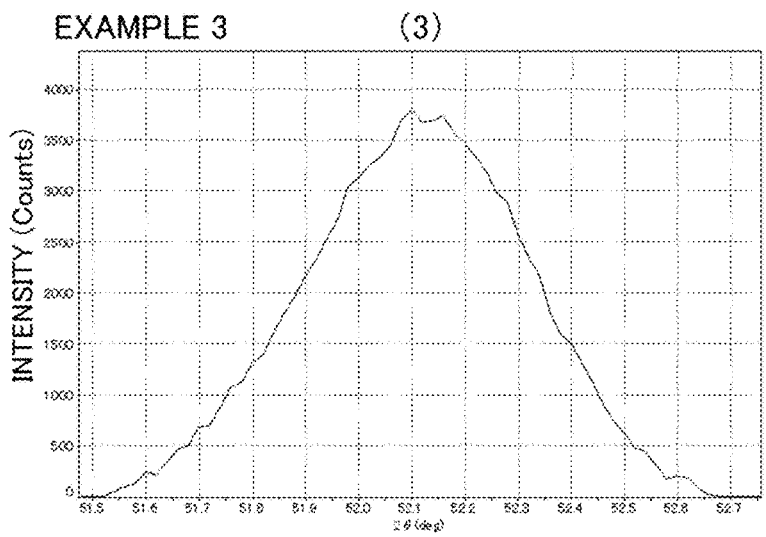
FIG. 16C is an enlarged view of a peak (3) after the peaks of $In_2O_3$ are removed from the XRD chart shown in FIG. 13.
Figure 16D:
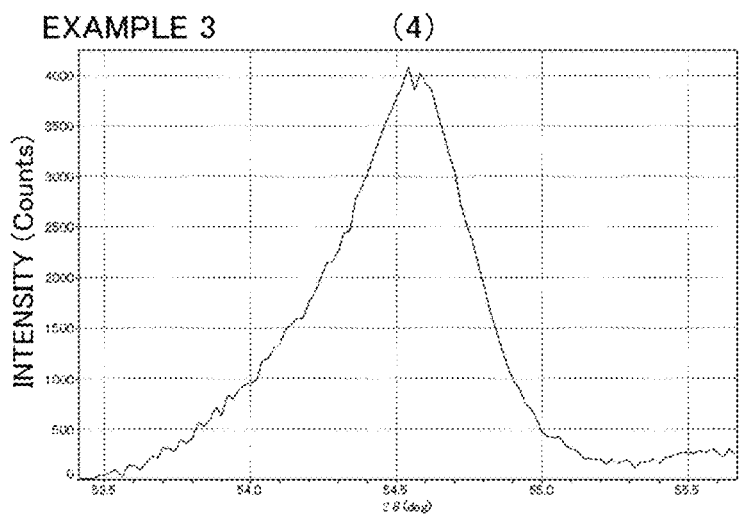
FIG. 16D is an enlarged view of a peak (4) after the peaks of $In_2O_3$ are removed from the XRD chart shown in FIG. 13.
Figure 16E:
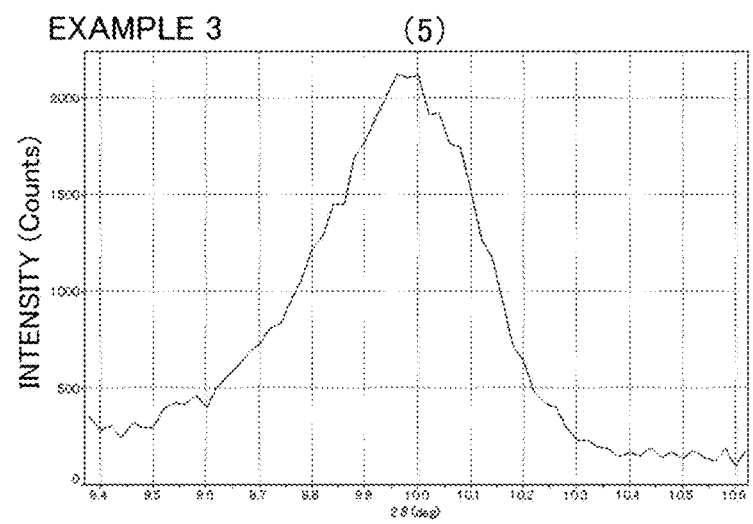
FIG. 16E is an enlarged view of a peak (5) after the peaks of $In_2O_3$ are removed from the XRD chart shown in FIG. 13.
Figure 16F:
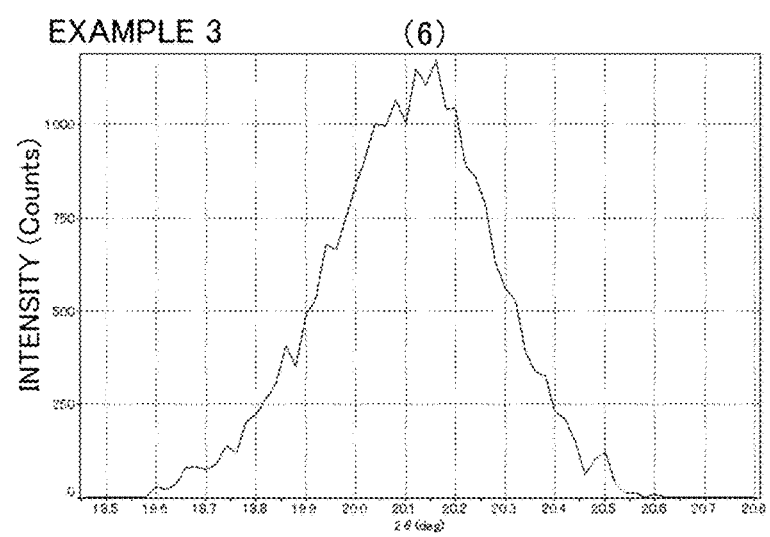
FIG. 16F is an enlarged view of a peak (6) after the peaks of $In_2O_3$ are removed from the XRD chart shown in FIG. 13.

It is found from FIGS. 11 to 13 that the obtained sintered oxides had and In$_2$O$_3$ crystalline phase and an unknown crystalline phase unaccountable by In$_2$O$_3$ crystalline phase. Six largest peaks (1), (2), (3), (4), (5), (6) are selected from ones having a large intensity of the peaks of the unknown crystalline phase, whose 2θ values are shown in Table 1 and FIGS. 14A to 16F. It is found that the compound has characteristic peaks at 2θ value ranges of 31 to 34 degrees, 36 to 39 degrees, 50 to 54 degrees, 53 to 57 degrees, 9 to 11 degrees, and 19 to 21 degrees in a descending order of the intensity of the peaks.

(1-2) Lattice Constant

The obtained XRD patterns were analyzed through WPF (Whole Pattern Fitting) using JADE6 to identify the crystal components contained in the XRD pattern and calculate the lattice constant of the $In_2O_3$ crystalline phase in the obtained sintered oxide.

(2) Relative Density

The relative density of the obtained sintered oxide was calculated.

The "relative density" herein refers to a value represented by percentage obtained by dividing an actual density of the sintered oxide, which is measured by Archimedes method, by a theoretical density of the sintered oxide. In the invention, the theoretical density is calculated as follows.

Theoretical density=(total weight of material powder for the sintered oxide)/(total volume of the material powder of the sintered oxide)

For instance, when use amounts (charge amounts) of an oxide A, oxide B, oxide C, and oxide D, which are materials of the material powder of the sintered oxide, are represented by a (g), b (g), c (g), and d (g), respectively, the theoretical density can be calculated according to the formula below.

Theoretical density=$(a+b+c+d)/((a/\text{density of oxide } A)+(b/\text{density of oxide } B)+(c/\text{density of oxide } C)+(d/\text{density of oxide } D))$ It should be noted that the density of each of the oxides is substantially equal to the specific gravity of each of the oxides. Accordingly, the value of the specific gravity described in "Handbook of Chemistry: Pure Chemistry, Chemical Society of Japan, revised 2nd ed. (MARUZEN-YUSHODO Company, Limited) was used as the value of the density.

(3) Bulk Resistivity (mΩ·cm)

The bulk resistivity (mΩ·cm) of the obtained sintered oxide was measured according to a four-probe method (JIS R1637) using a resistivity meter Loresta (manufactured by Mitsubishi Chemical Corporation).

Five points (the center of the sintered oxide, and four middle points between four corners of the sintered oxide and the center of the sintered oxide) were measured and averaged to calculate the bulk resistivity.

(4) Stability in Sputtering

The sintered oxide of Example 1 from among the obtained sintered oxides was ground and polished to prepare a sputtering target of 4-inch diameter×5 mm thick. Then, with the use of the prepared sputtering target, DC sputtering at 400 W power was conducted continuously for five hours. The conditions on the surface of the target after the DC sputtering was visually checked.

The results are shown in Table 1.

TABLE 1

| | | Sample No. | | |
|---|---|---|---|---|
| | | Example 1 | Example 2 | Example 3 |
| Mass ratio [mass %] | $Ga_2O_3/(In_2O_3 + Ga_2O_3 + Al_2O_3)$ | 9.5 | 8.0 | 20.0 |
| | $Al_2O_3/(In_2O_3 + Ga_2O_3 + Al_2O_3)$ | 8.0 | 5.0 | 7.0 |
| | $In_2O_3/(In_2O_3 + Ga_2O_3 + Al_2O_3)$ | 82.5 | 87.0 | 73.0 |
| Atomic ratio [—] | Ga/(In + Ga + Al) | 0.119 | 0.105 | 0.243 |
| | Al/(In + Ga + Al) | 0.184 | 0.121 | 0.157 |
| | In/(In + Ga + Al) | 0.697 | 0.774 | 0.600 |
| | Ga/(In + Ga) | 0.146 | 0.119 | 0.288 |
| | Crystalline phase by XRD | $In_2O_3$ Crystal A | $In_2O_3$ Crystal A | $In_2O_3$ Crystal A |
| | Lattice constant of $In_2O_3$ crystal phase [$10^{-10}$ m] | 10.11238 | 10.09614 | 10.09221 |
| | Relative density [%] | 99.6 | 98.1 | 98.6 |
| | Actual density [g/cm$^3$] | 6.65 | 6.71 | 6.57 |
| | Calculated density (theoretical density) [g/cm$^3$] | 6.68 | 6.84 | 6.66 |
| | Bulk resistivity [mΩ · cm] | 8.1 | 8.2 | 8.6 |
| | Results of visual check on the target surface after 400 W DC sputtering continuously for five hours | No significant abnormality except for shape change in erroded part | — | — |
| Peak top 2θ of Crystal A | (1) | 32.4 | 32.5 | 32.3 |
| | (2) | 37.1 | 37.2 | 37.0 |
| | (3) | 52.3 | 52.4 | 52.1 |
| | (4) | 54.8 | 54.9 | 54.5 |
| | (5) | 9.9 | 10.1 | 10.0 |
| | (6) | 20.1 | 20.2 | 20.1 |

As shown in Table 1, Example 1, whose composition satisfies the formulae (4) to (6), showed 2θ at the peaks (1) to (6) of the crystal A in the range satisfying the formulae (A) to (F). Example 1 showed high relative density, low bulk resistivity, and no occurrence of cracks or foreign body at the time of sputtering.

Examples 2 and 3 had similar compositions and crystal structures.

Preparation of Thin-Film Transistor

Example A

A thin-film transistor was prepared according to a process below.

(1) Film-Formation Step

A sintered oxide prepared in Example 1 was ground and polished to prepare a sputtering target of 4-inch diameter×5 mm-thick. At this time, the sputtering target was smoothly prepared without causing cracks or the like. A 50-nm thin film (oxide semiconductor layer) was formed on a silicon wafer 20 (gate electrode) coated with a thermally oxidized film (gate insulating film) through sputtering via a metal mask using the prepared sputtering target under the film-formation conditions shown in Table 2. At this time, sputtering gas in a form of mixture gas of high-purity argon and 1% high-purity oxygen was used for sputtering.

Further, a sample provided solely with a 50-nm-thick oxide semiconductor layer on a glass substrate was simultaneously prepared under the same conditions. The glass substrate was made of ABC-G manufactured by Nippon Electric Glass Co., Ltd.

(2) Formation of Source/Drain Electrodes

Next, source/drain electrodes in a form of titanium electrodes were formed through sputtering of titanium metal using a metal mask with a pattern corresponding to contact holes for the source/drain. The obtained sample was subjected to a heat treatment in atmospheric air at 350 degrees C. for 30 minutes to prepare a thin-film transistor before the protective insulation film was formed.

(3) Formation of Protective Insulation Film $SiO_2$ film (protective insulation film; interlayer insulating film) was formed on the semiconductor film of the thin-film transistor before the protective insulation film was formed (i.e. the thin-film transistor prepared in (2)) through CVD (Chemical Vapor Deposition) at a substrate temperature of 300 degrees C. After the $SiO_2$ film was formed, the obtained sample was subjected to a heat treatment in atmospheric air at 350 degrees C. for 1 minute to prepare a thin-film transistor with the protective insulation film formed thereon. Subsequently, contact holes were formed at source/drain portions using a probe pin of a device to achieve electrical contact, thereby preparing a thin-film transistor.

Below-described properties of the thus prepared thin-film transistor, and the sample made of the glass substrate and the oxide semiconductor layer were evaluated. The results are shown in Table 2.

Property Evaluation of Semiconductor Film

Measurement of Hall Effect:

After the sample made of the glass substrate and the oxide semiconductor layer shown in FIG. 17A was subjected to a heat treatment under the same conditions as in the heat treatment after formation of semiconductor film in Table 2, a 1×1 cm square sample piece was cut from the sample and gold (Au) was applied on four corners of the sample piece using a metal mask and an ion coater to form a film at a size approximately 2 mm×2 mm or less. Then, indium solder was applied on the Au metal for enhanced electrical contact, thereby providing a Hall-effect measurement sample.

The Hall-effect measurement sample was set to a Hall-effect/specific resistance measurement system (ResiTest 8300, manufactured by TOYO Corporation) to evaluate the Hall effect and determine the carrier density and carrier mobility at a room temperature. The results are shown in "semiconductor film properties obtained after applying heat treatment after forming semiconductor film" in Table 2.

Further, the oxide semiconductor layer of the obtained sample was analyzed using an ICP-AES (Inductively Coupled Plasma-Atomic Emission Spectrometer, manufactured by Shimadzu Corporation). As a result, it was found that the atomic ratio of the obtained oxide semiconductor film was the same as the atomic ratio of the sintered oxide used for preparing the oxide semiconductor film.

The same Hall measurement as the above was conducted after forming an $SiO_2$ film using a CVD apparatus at a substrate temperature of 300 degrees C. on the semiconductor film of the Hall-effect measurement sample obtained after heat treatment, as shown in FIG. 17B. The results are shown in "semiconductor film properties immediately after $SiO_2$ film is formed through CVD at substrate temperature of 300 degrees C." in Table 2.

Further, after the sample with the $SiO_2$ film being formed under the conditions shown in Table 2 was further subjected to a heat treatment, the same Hall measurement as the above was conducted on the semiconductor film of the obtained sample. At this time, a measurement probe was stuck into the $SiO_2$ film until reaching Au layer for electrical contact. The results are shown in "semiconductor film properties obtained after $SiO_2$ film is formed through CVD at substrate temperature of 300 degrees C. and further subjected to heat treatment" in Table 2.

Crystal Property of Semiconductor Film

On the sample made of glass substrate and oxide semiconductor layer, the crystallinity of the film without being heated after the film was formed by sputtering (immediately after being deposited) and the film after the heat treatment after film-formation shown in Table 2 was applied was measured and evaluated through XRD (X-Ray Diffraction). Then, it was found that the film was amorphous before being subjected to the heat treatment and was also amorphous after being subjected to the heat treatment.

Band Gap of Semiconductor Film:

Transmission spectrum of the sample made of glass substrate and oxide semiconductor layer and subjected to the heat treatment under the heat treatment conditions shown in Table 2 was measured, whose results were plotted in a graph (abscissa axis: wavelength, ordinate axis: transmittance). Then, after the wavelength in abscissa axis was converted into energy (eV) and the transmittance in ordinate axis was converted into:

$$(\alpha h \nu)^2$$

where
  α: absorption coefficient,
  h: Planck's constant, and
  ν: oscillation frequency, a straight line was fitted to a rising portion of the absorption and an eV value at an intersection of the straight line with a base line was calculated as the band gap of the semiconductor film.

Properties Evaluation of TFT

The saturation mobility, threshold voltage, On/Off ratio, and off-current of the TFT before an insulation protection film ($SiO_2$ film) was formed were evaluated. The results are shown in "TFT properties after heat treatment and before formation of $SiO_2$ film" in Table 2.

The below-described properties of TFT after the insulation protection film ($SiO_2$ film) was formed and the heat treatment was applied was evaluated using a measurement probe stuck into the $SiO_2$ film to reach a metal titanium layer. The results are shown in "TFT properties obtained after $SiO_2$ film is formed through CVD at substrate temperature of 300 degrees C. and further subjected to heat treatment" in Table 2.

The saturation mobility was determined based on a transfer function when 5 V drain voltage was applied. Specifically, the saturation mobility was calculated by: plotting a graph of a transfer function Id-Vg; calculating transconductance (Gm) for each Vg; and calculating the saturation mobility using a formula in a linear region. It should be noted that Gm is represented by $\partial(Id)/\partial(Vg)$, and the saturation mobility is defined by a maximum carrier mobility in a Vg range from −15 to 25 V. The saturation mobility herein is evaluated according to the above unless otherwise specified. In the above, Id represents a current between source and drain electrodes, and Vg represents a gate voltage when the voltage Vd is applied between the source and drain electrodes.

The threshold voltage (Vth) is defined as Vg at $Id=10^{-9}$ A based on the graph of the transfer function.

The On/Off ratio is determined as a ratio [On/Off] of On current value (a value of Id when Vg=20 V) to Off current value (a value of Id when Vg=−10 V).

Example B

A thin-film transistor was prepared and evaluated in the same manner as in Example A under the conditions shown in Table 2 except that the heat treatment after (2) formation of source/drain electrodes in Example A was not performed. The results are shown in Table 2. The oxide semiconductor layer after the heat treatment on the protective insulation film was determined to be amorphous as a result of XRD measurement.

In the same manner as in Example A, it was determined that the atomic ratio of the obtained oxide semiconductor film was the same as the atomic ratio of the sintered oxide used for preparation of the oxide semiconductor film.

The results are shown in Table 2.

detailed mechanism is unknown, it is speculated that the saturation mobility of TFT increases because the carriers disappear by reaction with oxygen from near the surface of the semiconductor film, where the carrier density is high, while the carriers in the semiconductor film near the gate insulating film does not completely disappear, thereby increasing the carrier density near the gate insulating film.

The invention claimed is:

1. An amorphous oxide semiconductor film comprising indium oxide, gallium oxide and aluminum oxide as main components, the amorphous oxide semiconductor film satisfying atomic ratios as defined in formulae (7X) and (8) to (10) below, $$0.08 \leq Ga/(In+Ga) < 0.15 \quad (7X),$$

$$0.08 \leq Ga/(In+Ga+Al) \leq 0.30 \quad (8),$$

$$0.05 < Al/(In+Ga+Al) < 0.20 \quad (9), \text{ and}$$

$$0.40 \leq In/(In+Ga+Al) \leq 0.87 \quad (10),$$

where In, Al, and Ga represent the number of atoms of indium element, aluminum element, and gallium element in the amorphous oxide semiconductor film, respectively.

TABLE 2

| | | Example A | Example B |
|---|---|---|---|
| film-formation conditions of semiconductor film | atmosphere gas | Ar + $O_2$ | Ar + $O_2$ |
| | back-pressure before film-formation (Pa) | $5.0 \times 10^{-4}$ | $5.0 \times 10^{-4}$ |
| | sputtering pressure in film-formation (Pa) | 0.5 | 0.5 |
| | substrate temperature in film-formation (° C.) | room temperature | room temperature |
| | oxygen partial pressure in film-formation (%) | 1 | 1 |
| heat treatment conditions after forming semiconductor film | heat treatment after film-formation: temperature (° C.) | 350 | — |
| | : temperature increase rate (° C./min.) | 10 | — |
| | : time (min.) | 30 | — |
| | : atmosphere | atmospheric air | — |
| semiconductor film properties obtained after applying heat treatment after forming semiconductor film | Film thickness (nm) | 50 | 50 |
| | Hall measurement carrier density ($cm^{-3}$) | $1.91 \times 10^{16}$ | — |
| | Hall measurement mobility ($cm^2/V \cdot sec$) | 12.7 | — |
| | crystallinity immediately after film deposition (XRD) | amorphous | amorphous |
| | crystallinity immediately after heating (XRD) | amorphous | amorphous |
| | band gap of semiconductor film (eV) | 3.4 | 3.4 |
| semiconductor film properties immediately after $SiO_2$ film is formed through CVD at substrate temperature of 300 degrees C. | Hall measurement carrier density ($cm^{-3}$) | $5.66 \times 10^{19}$ | $9.56 \times 10^{19}$ |
| | Hall measurement mobility ($cm^2/V \cdot sec$) | 18.6 | 75.2 |
| semiconductor film properties obtained after $SiO_2$ film is formed through CVD at substrate temperature of 300 degrees C. and further subjected to heat treatment | heat treatment: temperature (° C.) | 350 | 350 |
| | : time (min.) | 60 | 60 |
| | : atmosphere | atmospheric air | atmospheric air |
| | Hall measurement carrier density ($cm^{-3}$) | $7.71 \times 10^{17}$ | $9.84 \times 10^{17}$ |
| | Hall measurement mobility ($cm^2/V \cdot sec$) | 28.6 | 31.4 |
| TFT properties after heat treatment and before formation of $SiO_2$ film | saturation mobility ($cm^2/V \cdot sec$) | 15.3 | — |
| | Vth (V) | −0.4 | — |
| | on/off ratio | $>10^8$ | — |
| | off current (A) | $<10^{-12}$ | — |
| TFT properties obtained after $SiO_2$ film is formed through CVD at substrate temperature of 300 degrees C. and further subjected to heat treatment | saturation mobility ($cm^2/V \cdot sec$) | 24.8 | 42.7 |
| | Vth (V) | −2.4 | −3.1 |
| | on/off ratio | $>10^7$ | $>10^7$ |
| | off current (A) | $<10^{-11}$ | $<10^{-11}$ |

As shown in Table 2, the TFT in Example 1 exhibited saturation mobility of 5 $cm^2/V \cdot s$ or more, the On/Off ratio of $1 \times 10^6$ or more, and the off-current of $1 \times 10^{-11}$ A or less, satisfying the requirement desirable for TFT.

Example B exhibited substantially the same results, except that the saturation mobility of TFT was larger than that in Example A. The carrier density inside the semiconductor increases by forming the oxide semiconductor under low-oxygen environment through CVD. The carrier density reduces during the subsequent heat treatment. Though 2. A thin-film transistor comprising the amorphous oxide semiconductor film according to claim 1.

3. The thin-film transistor according to claim 2, wherein a saturation mobility of the thin-film transistor is 5 $cm^{-2}/V \cdot s$ or more.

4. The thin-film transistor according to claim 2, wherein an On/Off ratio of the thin-film transistor is $1 \times 10^6$ or more.

5. The thin-film transistor according to claim 2, wherein an off current of the thin-film transistor is $1 \times 10^{-11}$ A or less.

6. An electronic device comprising the thin-film transistor according to claim 2.

7. The amorphous oxide semiconductor film of claim 1, wherein the number of atoms of aluminum element in the amorphous oxide semiconductor film satisfies the following formula (9X):

$$0.06 \leq Al/(In+Ga+Al) < 0.20 \tag{9X}$$

8. The amorphous oxide semiconductor film of claim 1, wherein he amorphous oxide semiconductor film satisfying atomic ratios as defined in formulae (7X) and (8B) to (10B) below:

$$0.08 \leq Ga/(In+Ga) < 0.15 \tag{7X}$$

$$0.08 \leq Ga/(In+Ga+Al) \leq 0.15 \tag{8B}$$

$$0.06 \leq Al/(In+Ga+Al) \leq 0.19 \tag{9B, and}$$

$$0.60 \leq In/(In+Ga+Al) \leq 0.83 \tag{10B}$$

* * * * *